(12) United States Patent
Matsumoto et al.

(10) Patent No.: US 8,456,401 B2
(45) Date of Patent: Jun. 4, 2013

(54) DISPLAY DEVICE

(75) Inventors: Katsumi Matsumoto, Mobara (JP);
Kozo Yasuda, Mobara (JP); Yasukazu Kimura, Chiba (JP); Takuo Kaitoh, Mobara (JP); Toshihiko Itoga, Chiba (JP); Hiroshi Kageyama, Hachiouji (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 978 days.

(21) Appl. No.: 12/222,339

(22) Filed: Aug. 7, 2008

(65) Prior Publication Data

US 2009/0073149 A1    Mar. 19, 2009

(30) Foreign Application Priority Data

Aug. 13, 2007  (JP) ................................. 2007-210876

(51) Int. Cl.
*G09G 3/36* (2006.01)
*H01L 31/00* (2006.01)
*H01L 31/036* (2006.01)

(52) U.S. Cl.
USPC .................. 345/92; 345/90; 257/57; 257/59; 257/66; 257/72

(58) Field of Classification Search
USPC ................ 345/90, 92, 93; 257/43, 57, 59, 66, 257/72, 75, 79, 347, 404
See application file for complete search history.

(56) References Cited

U.S. PATENT DOCUMENTS

| 5,614,752 | A | * | 3/1997 | Takenaka | 257/408 |
| 5,898,204 | A | | 4/1999 | Watanabe | |
| 6,107,654 | A | * | 8/2000 | Yamazaki | 257/194 |
| 6,686,623 | B2 | * | 2/2004 | Yamazaki | 257/315 |
| 6,949,767 | B2 | * | 9/2005 | Yamazaki | 257/72 |
| 7,339,190 | B2 | * | 3/2008 | Chen et al. | 257/66 |
| 7,598,526 | B2 | * | 10/2009 | Godo | 257/72 |
| 7,872,722 | B2 | * | 1/2011 | Kimura | 349/141 |
| 2002/0158995 | A1 | * | 10/2002 | Hwang et al. | 349/43 |
| 2007/0037070 | A1 | * | 2/2007 | Ohnuma et al. | 430/5 |
| 2009/0291516 | A1 | * | 11/2009 | Takayama et al. | 438/26 |

FOREIGN PATENT DOCUMENTS

| JP | 64-66969 A | 3/1989 |
| JP | 1-138760 A | 5/1989 |
| JP | 04-075387 | 7/1990 |
| JP | 07-094744 | 9/1993 |

(Continued)

*Primary Examiner* — William Boddie
*Assistant Examiner* — Alecia D English
(74) *Attorney, Agent, or Firm* — Stites & Harbison PLLC; Juan Carlos A. Marquez, Esq.; Stephen J. Weyer, Esq.

(57) ABSTRACT

The gate electrode is formed above the polycrystalline semiconductor layer through the gate insulating film. The polycrystalline semiconductor layer includes a first region overlapping with the gate electrode in plan view. The first region is sandwiched between the second region and the third region. The second region of the polycrystalline semiconductor layer includes a first impurity diffusion region and two second impurity diffusion regions opposite in conductivity type to the first impurity diffusion region. The first region and the first impurity diffusion region are in contact with each other at a first boundary. The first region and the two second impurity diffusion regions are in contact with each other at second boundaries. The two second impurity diffusion regions sandwiching the first impurity diffusion region are provided along the gate electrode. Thus, a leak current is suppressed.

17 Claims, 19 Drawing Sheets

FOREIGN PATENT DOCUMENTS

| | | |
|---|---|---|
| JP | 07-326764 | 6/1994 |
| JP | 08-160469 | 8/1995 |
| JP | 7-326763 | 12/1995 |
| JP | 8-64833 A | 3/1996 |
| JP | 10-138760 A | 6/1998 |
| JP | 2002-231964 | 8/2002 |

* cited by examiner

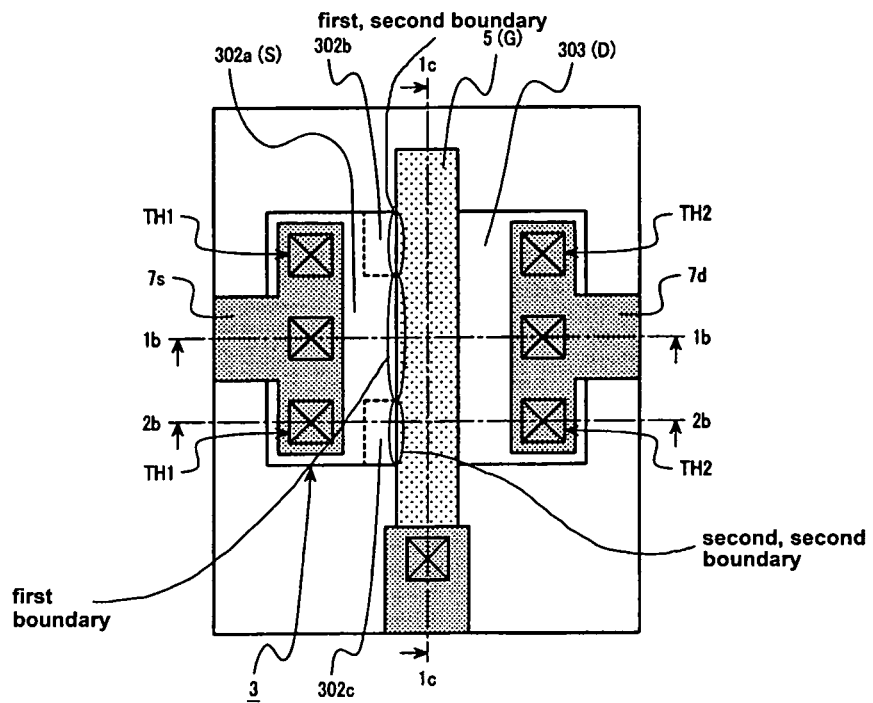
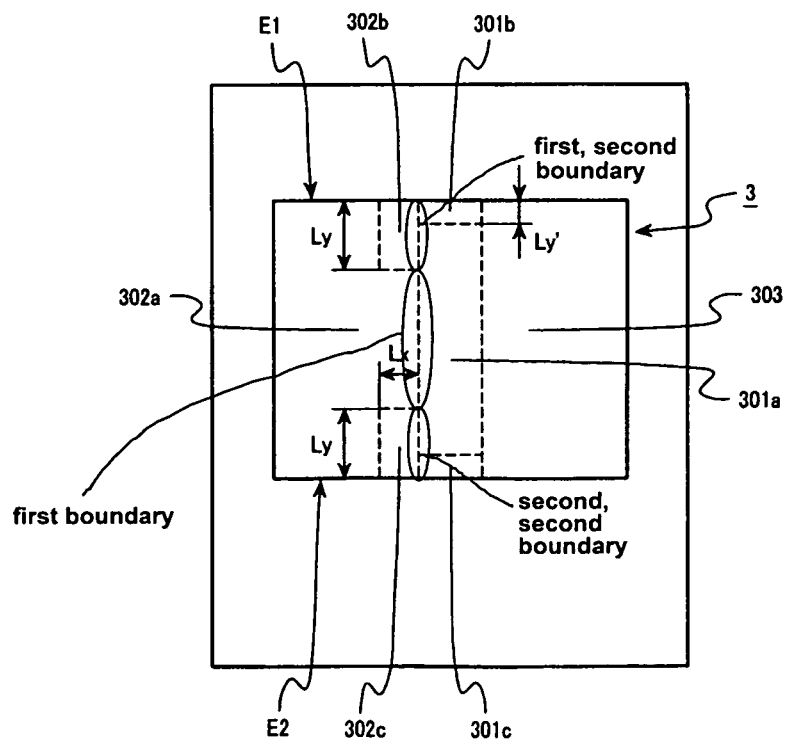

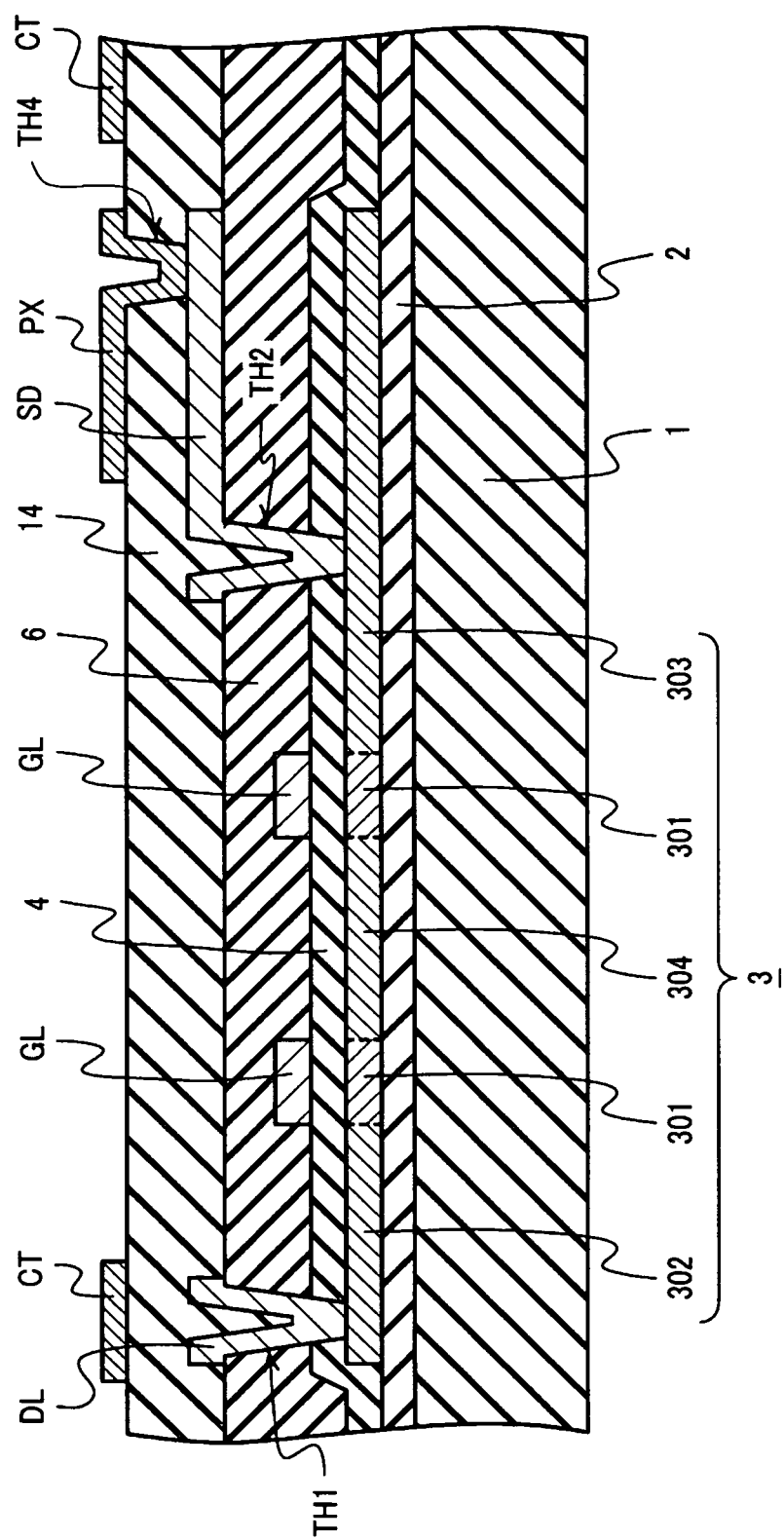

DISPLAY DEVICE

CROSS-REFERENCE TO RELATED APPLICATIONS

The present application claims priority from Japanese patent application JP 2007-210876 filed on Aug. 13, 2007, the content of which is hereby incorporated by reference into this application.

BACKGROUND OF THE INVENTION

1. Field of the Invention

The present invention relates to a display device, and more particularly, to a technology effectively applied to a display device including a top gate TFT element using a polycrystalline semiconductor.

2. Description of the Related Art

An example of a display device including a TFT element having a MIS structure (including MOS structure) is an active matrix TFT liquid crystal display device.

The active matrix TFT liquid crystal display device includes a TFT liquid crystal display panel in which a liquid crystal material is sealingly filled between two substrates. One of the two substrates (hereinafter, referred to as TFT substrate) has a display area in which TFT elements used as active elements (hereinafter, sometimes referred to as switching elements) are arranged in matrix.

Up to now, in many cases, each of the TFT elements used as the active elements in the TFT substrate has a semiconductor layer made of an amorphous semiconductor such as amorphous silicon (a-Si). However, in recent years, the semiconductor layer of the TFT element used as the active element in a TFT liquid crystal display device is made of, for example, a polycrystalline semiconductor such as polycrystalline silicon (poly-Si).

In a conventional normal TFT liquid crystal display device, driver circuits (integrated circuits) such as a gate driver for generating and controlling scanning signals supplied to scanning signal lines (hereinafter, sometimes referred to as scanning driver) and a data driver for generating and controlling video signals supplied to video signal lines are mounted as chip parts (driver ICs) separately from the liquid crystal display panel. However, in recent years, for example, the TFT liquid crystal display device includes the driver circuits such as the gate driver and the data driver which are provided outside the display area of the TFT substrate.

The driver circuits such as the gate driver and the data driver should be operated at higher speed than the active elements in the display area. Therefore, when the driver circuits are to be provided outside the display area of the TFT substrate, the driver circuits desirably include TFT elements using the polycrystalline semiconductor.

The polycrystalline semiconductor used for the TFT element of a semiconductor device such as the TFT liquid crystal display device is, for example, low-temperature polycrystalline silicon (LTPS) in many cases. When the low-temperature polycrystalline silicon is to be formed, for example, an amorphous silicon film is formed on a surface of an insulating substrate and crystallized after being melted. Therefore, when the TFT element using the low-temperature polycrystalline silicon is to be formed, a semiconductor layer (low-temperature polycrystalline silicon layer), a gate insulating film, and a gate electrode are formed in the stated order on the insulating substrate in many cases. The TFT element in which the gate electrode is laminated above the semiconductor layer as viewed from the insulating substrate side is called a top gate TFT element.

In the case of the top gate TFT element, for example, the semiconductor layer, the gate insulating film, and the gate electrode are formed. After that, impurities are implanted into the semiconductor layer using the gate electrode as a mask to form a source diffusion region and a drain diffusion region. In such a manufacturing method, the gate electrode and the semiconductor layer should be crossed in order to separate the source diffusion region and the drain diffusion region from each other.

However, when the gate electrode crosses the semiconductor layer in the top gate TFT element using the LTPS, for example, there is a problem in that a conduction current or an on-resistance varies while the TFT element is in a conductive state (on-state). The problem is remarkable, for example, in the case of a TFT element having a reduced gate width (channel width).

When the gate electrode crosses the semiconductor layer in the top gate TFT element using the LTPS, for example, there is a problem in that a leak current flows between a source and a drain while the TFT element is in a non-conductive state (off-state).

In recent years, in order to solve, of the two problems described above, the problem that the leak current flows between the source and the drain, for example, some methods of changing a two-dimensional shape of the TFT element into a shape in which the leak current is prevented from easily flowing have been proposed (see, for example, JP 07-326764 A and JP 08-160469 A).

As described above, the semiconductor device including the top gate TFT element using the LTPS has the problem that the conduction current or the on-resistance easily varies while the TFT element is in the conductive state and the problem that the leak current flows while the TFT element is in the non-conductive state.

One of the reasons why the leak current flows between the source and the drain while the top gate TFT element using the LTPS is in the non-conductive state (off-state) is as follows. That is, the action of an electric field directed from the gate electrode to edge portions (portions close to etching end surfaces) of a region of the semiconductor layer which overlaps with the gate electrode (hereinafter, sometimes referred to as channel region) are different from the action of an electric field directed from the gate electrode to a central portion of the region of the semiconductor layer.

Therefore, in the case of the TFT element described in JP 07-326764 A, for example, a gate length (hereinafter, sometime referred to as channel length) of each of both sides (edge portions) parallel to a direction in which the current flows, of the region of the semiconductor layer which overlaps with the gate electrode (hereinafter, sometime referred to as channel region) is set to a value larger than a gate length of the central portion. Thus, the leak current is prevented from flowing between the source and the drain.

In the case of the TFT element described in JP 08-160469 A, for example, the gate electrode is formed into a ring shape to eliminate the edge portions parallel to the direction in which the current flows, from the region of the semiconductor layer which overlaps with the gate electrode. Therefore, the leak current is prevented from flowing between the source and the drain.

SUMMARY OF THE INVENTION

According to the method described in JP 07-326764 A, the leak current can be reduced. However, it is difficult to completely prevent the leak current from flowing.

According to the method described in JP 08-160469 A, leak current can be eliminated. However, an occupied area of each TFT element increases. Thus a region necessary to form circuits expands.

It is an object of the present invention to provide a technology capable of suppressing a leak current in a display device.

Another object of the present invention is to provide a technology capable of suppressing a leak current without an increase in circuit area in a display device.

Another object of the present invention is to provide a technology capable of reducing a variation in conduction current or on-resistance in a display device.

The above and other objects and novel features of the present invention will become apparent from the description of this specification and the attached drawings.

The summary of representative examples of the invention disclosed in this application is as follows.

(1) A display device comprising: an insulating substrate; and a transistor which is provided above the insulating substrate and includes a polycrystalline semiconductor layer, a gate insulating film, and a gate electrode, wherein: the gate electrode is formed above the polycrystalline semiconductor layer through the gate insulating film; the polycrystalline semiconductor layer includes a first region overlapping with the gate electrode in plan view, a second region, and a third region; the first region is sandwiched between the second region and the third region; the second region of the polycrystalline semiconductor layer includes a first impurity diffusion region and two second impurity diffusion regions which are opposite in conductivity type to the first impurity diffusion region; the first region and the first impurity diffusion region are in contact with each other at a first boundary; the first region and the two second impurity diffusion regions are in contact with each other at second boundaries; and the two second impurity diffusion regions sandwiching the first impurity diffusion region are provided along the gate electrode.

(2) A display device according to item (1), wherein: the transistor comprises a side transistor in which a leak current is generated when an off-voltage is applied to the gate electrode; and each of the second boundaries has a length longer than a gate length of the side transistor.

(3) A display device according to item (1), wherein: the transistor comprises a plurality of side transistors in which a leak current is generated when an off-voltage is applied to the gate electrode.

(4) A display device according to item (1), further comprising a first transistor whose first impurity diffusion layer conductivity type is an n-type and a second transistor whose first impurity diffusion layer conductivity type is a p-type, which are formed above the insulating substrate.

(5) A display device according to item (1), further comprising a complementary inverter circuit which is formed above the insulating substrate and includes a first transistor whose first impurity diffusion layer conductivity type is an n-type and a second transistor whose first impurity diffusion layer conductivity type is a p-type.

(6) A display device according to item (1), further comprising an analog switch circuit which is formed above the insulating substrate and includes a first transistor whose first impurity diffusion layer conductivity type is an n-type and a second transistor whose first impurity diffusion layer conductivity type is a p-type.

(7) A display device according to item (1), further comprising a plurality of scanning signal lines, a plurality of video signal lines, a plurality of switching elements, a plurality of pixel electrodes, and an integrated circuit including the transistor, which are formed above the insulating substrate, in which: the plurality of switching elements and the plurality of pixel electrodes are arranged in matrix to form a display area; and the integrated circuit is provided outside the display area.

(8) A display device comprising: an insulating substrate; and a TFT element which is provided above the insulating substrate and includes a semiconductor layer with a polycrystalline semiconductor, a gate insulating film, and a gate electrode, wherein: the gate electrode three-dimensionally crosses the semiconductor layer; the semiconductor layer includes at least one first region having a form overlapping with the gate electrode in plan view, a second region, and a third region; the second region and the third region sandwich the first region and are in contact with the first region; the second region includes a first impurity diffusion region serving as a source of the TFT element and a second impurity diffusion region which is opposite in conductivity type to the first impurity diffusion region; the first region and the second region have a boundary therebetween and the boundary includes a first boundary at which the first region and the first impurity diffusion region are in contact with each other and two second boundaries at which the first region and the second impurity diffusion region are in contact with each other; and the two second boundaries sandwich the first boundary and are located closer to end portions of the semiconductor layer than the first boundary.

(9) A display device according to item (8), wherein: the TFT element comprises side transistors which are provided in the end portions of the semiconductor layer and in which a leak current is generated when an off-voltage is applied to the gate electrode; and each of the two second boundaries has a length in an extension direction of the gate electrode crossing the semiconductor layer, which is longer than a gate length of the side transistors.

(10) A display device according to item (8), wherein: one semiconductor layer of the TFT element formed above the insulating substrate includes a plurality of the first regions.

(11) A display device according to item (8), further comprising a first TFT element whose first impurity diffusion layer conductivity type is an n-type and a second TFT element whose first impurity diffusion layer conductivity type is a p-type, which are formed above the insulating substrate.

(12) A display device according to item (8), further comprising a complementary inverter circuit which is formed above the insulating substrate and includes a first TFT element whose first impurity diffusion layer conductivity type is an n-type and a second TFT element whose first impurity diffusion layer conductivity type is a p-type.

(13) A display device according to item (8), further comprising an analog switch circuit which is formed above the insulating substrate and includes a first TFT element whose first impurity diffusion layer conductivity type is an n-type and a second TFT element whose first impurity diffusion layer conductivity type is a p-type.

(14) A display device according to item (8), further comprising: a display area which is formed above the insulating substrate and includes a plurality of scanning signal lines, a plurality of video signal lines, a plurality of switching elements, and a plurality of pixel electrodes, which are arranged in matrix; and an integrated circuit including the TFT element, which is formed outside the display area.

(15) A display device according to item (8), further comprising: a pixel electrode; and a switching element having a MIS structure, which is connected to the pixel electrode, in which the pixel electrode and the switching element are formed above the insulating substrate.

The display device according to the present invention can suppress the leak current in the display device.

Also, the display device according to the present invention can suppress the leak current without the increase in circuit area.

Further, the display device according to the present invention can reduce the variation in conduction current or on-resistance.

BRIEF DESCRIPTION OF THE DRAWINGS

In the accompanying drawings:

FIG. 2A is a schematic plan view showing a structural example of a TFT element of a semiconductor device according to Embodiment 1 of the present invention;

FIG. 2C is a schematic plan view showing a structure of a semiconductor layer of FIG. 2A;

FIG. 7C is a cross sectional view taken along the line 7c-7c of FIG. 7B;

DETAILED DESCRIPTION OF THE INVENTION

Hereinafter, embodiments of the present invention are described in detail with reference to the attached drawings.

In all drawings used to describe the embodiments, members having the same functions are expressed by the same numerals and thus duplicated descriptions are omitted.

FIGS. 1A to 1E are schematic explanatory views and diagram showing a general structure of a conventional TFT element relating to the present invention and problem points thereof.

Figure 1A:
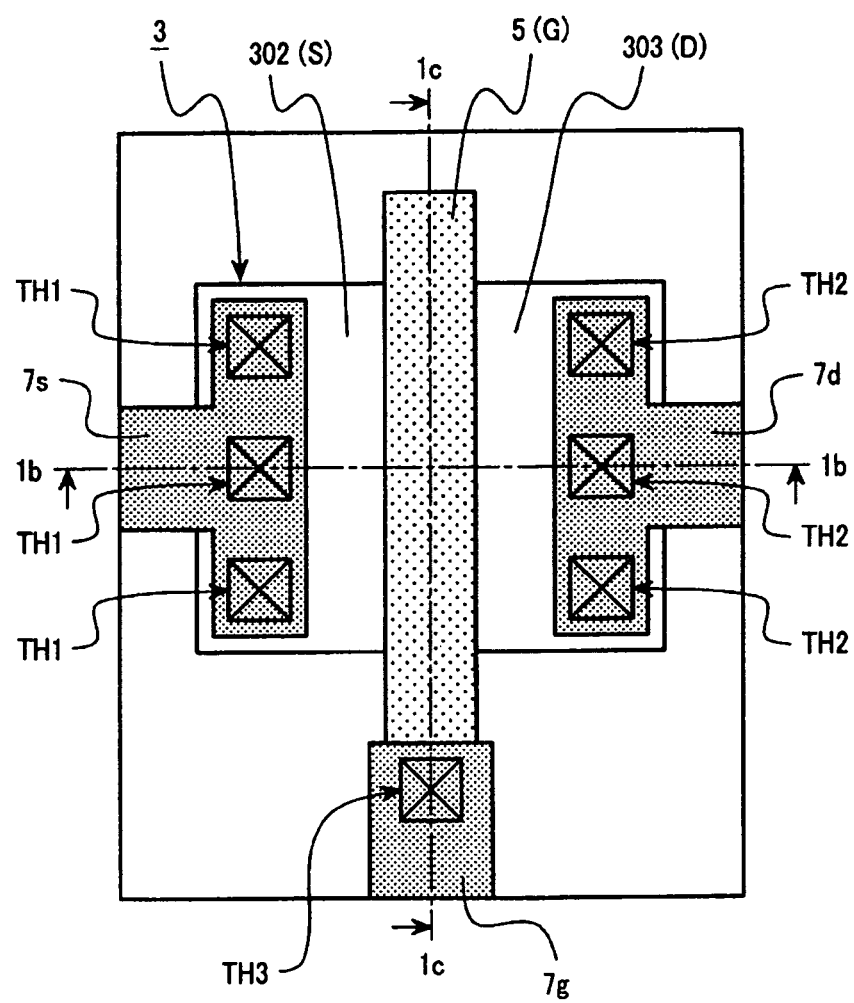
FIG. 1A is a schematic plan view showing a structural example of a conventional TFT element using a polycrystalline semiconductor.
Figure 1B:
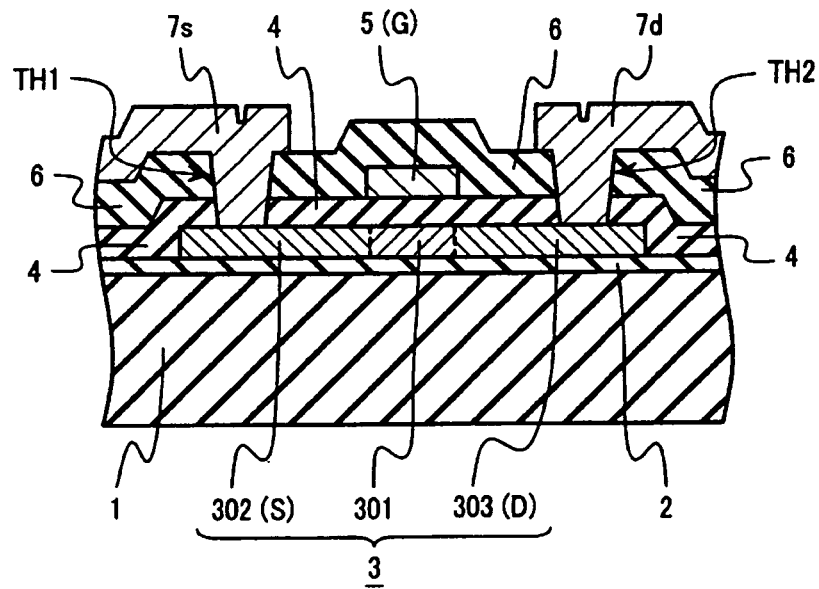
FIG. 1B is a cross sectional view taken along the line 1b-1b of FIG. 1A.
Figure 1C:
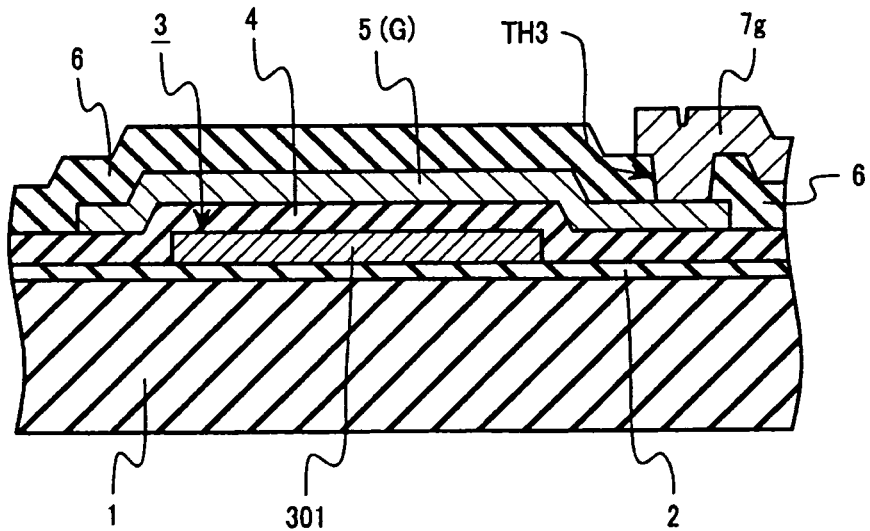
FIG. 1C is a cross sectional view taken along the line 1c-1c of FIG. 1A.
Figure 1D:
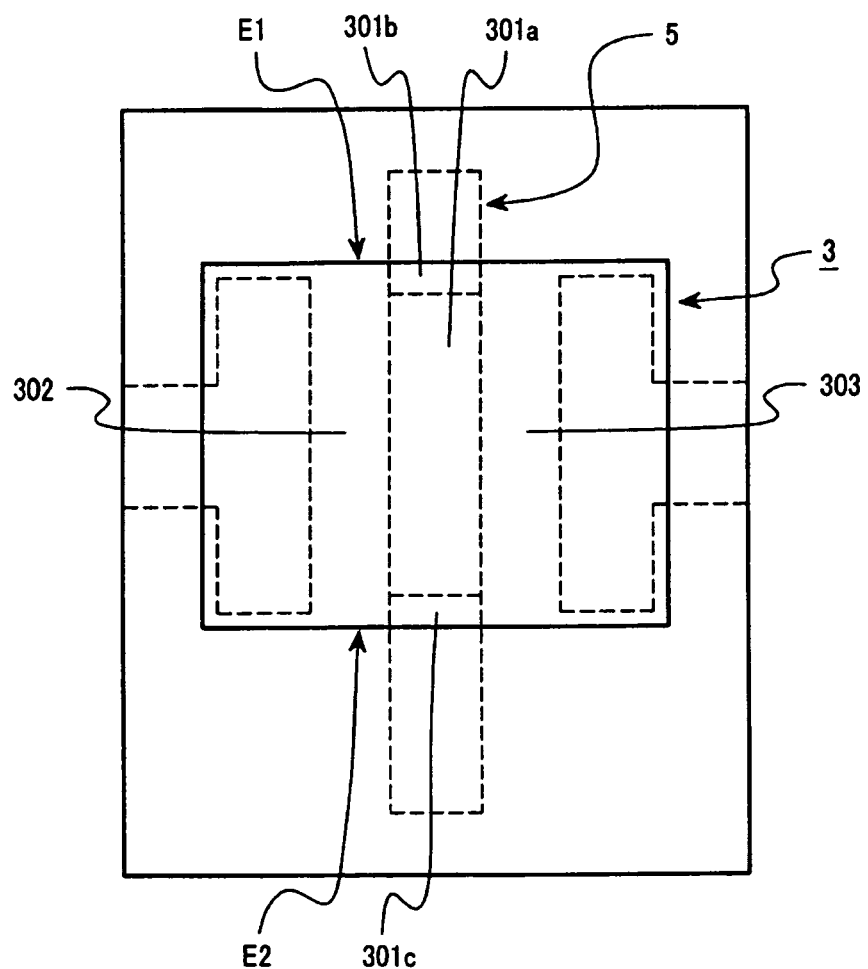
FIG. 1D is a schematic plan view showing a structure of a semiconductor layer of FIG. 1A.
Figure 1E:
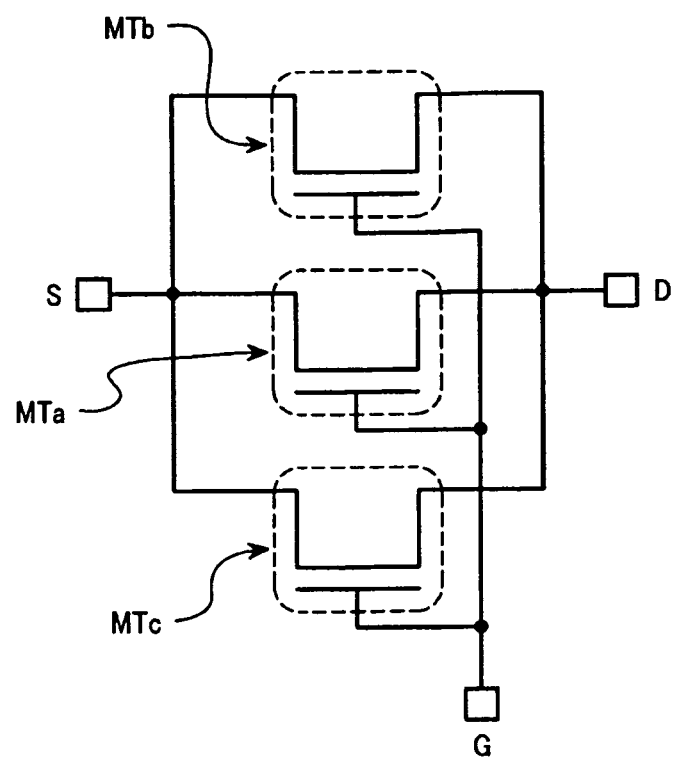
FIG. 1E is an equivalent circuit diagram showing the TFT element of FIGS. 1A to 1D.

FIG. 1A is a schematic plan view showing a structural example of the conventional TFT element using a polycrystalline semiconductor. FIG. 1B is a cross sectional view taken along a line 1b-1b of FIG. 1A. FIG. 1C is a cross sectional view taken along a line 1c-1c of FIG. 1A. FIG. 1D is a schematic plan view showing a structure of a semiconductor layer of FIG. 1A. FIG. 1E is an equivalent circuit diagram showing the TFT element of FIGS. 1A to 1D.

An example of a TFT element having a MIS structure, which is used for a conventional semiconductor device, includes a TFT element whose semiconductor layer is made of a polycrystalline semiconductor such as polycrystalline silicon (poly-Si). An example of the TFT element whose semiconductor layer is made of the polycrystalline semiconductor includes a TFT element in which a semiconductor layer, a gate insulating film, and a gate electrode are formed in the stated order on an insulating substrate. Such a TFT element is generally called a top gate TFT element. The present invention relates to the top gate TFT element using the polycrystalline semiconductor as described above.

The top gate TFT element using the polycrystalline semiconductor has, for example, the following structure. As shown in FIGS. 1A to 1C, a base insulating layer 2 is formed on a surface of an insulating substrate 1. A semiconductor layer 3 made of a polycrystalline semiconductor, a first insulating film 4 serving as a gate insulating film of the TFT element, a gate electrode 5, a second insulating film 6, and wirings 7s, 7d, and 7g are formed on the base insulating layer 2.

The base insulating layer 2 is an insulating layer for preventing the surface of the insulating substrate 1 from becoming rough, for example, when the semiconductor layer 3 is formed by etching.

The semiconductor layer 3 is formed by etching a polycrystalline semiconductor film (for example, polycrystalline silicon film). As shown in FIGS. 1B and 1D, for example, the semiconductor layer 3 is broadly divided into three regions, that is, a first region 301, a second region 302, and a third region 303. The first region 301 overlaps with the gate electrode 5 as viewed in plan and is sandwiched between the second region 302 and the third region 303. The first region 301 is a region in which a carrier path (channel) is formed while the corresponding TFT element is turned on (in conductive state). The second region 302 and the third region 303 in the conventional TFT element are in contact with the first region 301, and one of the regions is a source, and the other thereof is a drain. In the case of the TFT element shown in FIGS. 1A to 1C, the second region 302 corresponds to the source and the third region 303 corresponds to the drain.

The wiring 7s is connected to the second region 302 of the semiconductor layer 3 through through-holes TH1. The wiring 7d is connected to the third region 303 of the semiconductor layer 3 through through-holes TH2. The wiring 7g is connected to the gate electrode 5 through a through-hole TH3.

In the conventional TFT element described above, for example, as shown in FIG. 1D, the entire second region 302 is used for the source and the entire third region 303 is used for the drain. That is, when the TFT element is an n-channel MOS transistor (hereinafter, referred to as nMOS transistor), each of the entire second region 302 and the entire third region 303 is an n-type semiconductor region implanted with an impurity such as phosphorus (P) or arsenic (As). In this case, the first region 301 is, for example, a p-type semiconductor region, or an n-type semiconductor region different in impurity concentration from the second region 302 and the third region 303.

When the TFT element is a p-channel MOS transistor (hereinafter, referred to as pMOS transistor), each of the entire second region 302 and the entire third region 303 is a p-type semiconductor region implanted with an impurity such as boron (B). In this case, the first region 301 is, for example, an n-type semiconductor region, or a p-type semiconductor region different in impurity concentration from the second region 302 and the third region 303.

The TFT element is an element for controlling a current flowing through the first region 301 of the semiconductor layer 3 by an electric field directed from the gate electrode 5. The electric field acting on the first region 301 of the semiconductor layer 3 is desirably prevented from varying depending on the position. That is, a uniform electric field desirably acts on the entire first region 301 of the semiconductor layer 3.

However, in the case of the TFT element having the structure as shown in FIGS. 1A to 1C, the electric field acting on the first region 301 from the gate electrode 5 varies depending on the position. That is, as shown in FIG. 1D, an electric field acting on an etching end surface E1 of the first region 301 of the semiconductor layer 3 and a region 301b close thereto and an electric field acting on an etching end surface E2 of the first region 301 of the semiconductor layer 3 and a region 301c close thereto are different in strength from an electric field acting on a region 301a located between the two regions 301b and 301c.

In view of the position dependence of the electric field acting on the first region 301 of the semiconductor layer 3, the equivalent circuit of one TFT element of FIGS. 1A to 1C can be expressed as shown in, for example, FIG. 1E. That is, one TFT element of FIGS. 1A to 1C can be assumed to include three TFT elements MTa, MTb, and MTc which have two types and different transistor characteristics and are connected in parallel. The TFT element MTa of FIG. 1E corresponds to a TFT element whose channel is formed in the region 301a of the first region 301. The TFT element MTb of FIG. 1E corresponds to a TFT element whose channel is formed in the region 301b of the first region 301. The TFT element MTc of FIG. 1E corresponds to a TFT element whose channel is formed in the region 301c of the first region 301. Hereinafter, the TFT element MTa is referred to as a main body MOS element and each of the TFT elements MTb and MTc is referred to as a side MOS element.

Assume that the TFT element is of an enhancement type and has a relatively large gate width, while the TFT element is in the on-state (conductive state), the main body MOS element MTa is dominant and thus the presence of the side MOS elements MTb and MTc does not become a problem. In contrast to this, assume that the TFT element is of the enhancement type and has a relatively small gate width, while the TFT element is in the on-state (conductive state), a problem occurs that a conduction current or an on-resistance varies. Note that the enhancement type TFT element is also called a normally-off type TFT element and corresponds to a TFT element through which a drain current does not flow while the gate electrode 5 is equal in potential to the source, that is, while the TFT element is in the off-state (non-conductive state). In the enhancement type TFT element described above, for example, a conductivity type of the first region 301 of the semiconductor layer 3 is opposite to a conductivity type of each of the source and the drain.

In the enhancement type TFT element, the gate insulating film of each of the side MOS elements MTb and MTc is normally smaller in film thickness than the gate insulating film of the main body MOS element MTa. In the enhancement type TFT element, the gate electrode of each of the side MOS elements MTb and MTc has a curvature. Therefore, a threshold voltage Vth of each of the side MOS elements MTb and MTc of the enhancement type TFT element is generally shifted to the depletion side with respect to a threshold voltage Vth of the main body MOS element MTa. That is, in the enhancement type TFT element, each of the regions 301b and 301c of the first region 301 of the semiconductor layer 3 is larger in carrier amount than the region 301a of the first region 301 of the semiconductor layer 3. As a result, the conventional TFT element has a problem that, although the TFT element is of the enhancement type, a leak current (drain current) flows therethrough while the gate electrode 5 is equal in potential to the source, that is, while the TFT element is in the off-state (non-conductive state).

The following embodiments describe structural examples of a TFT element which has the same structure and size as the conventional TFT element shown in FIGS. 1A to 1C, can reduce a variation in conduction current or on-resistance, and can prevent a leak current from flowing, and structural examples of a circuit including the TFT element.

Embodiment 1

FIGS. 2A to 2D are schematic views and diagram showing a general structure of a semiconductor device according to Embodiment 1 of the present invention.

Figure 2B:
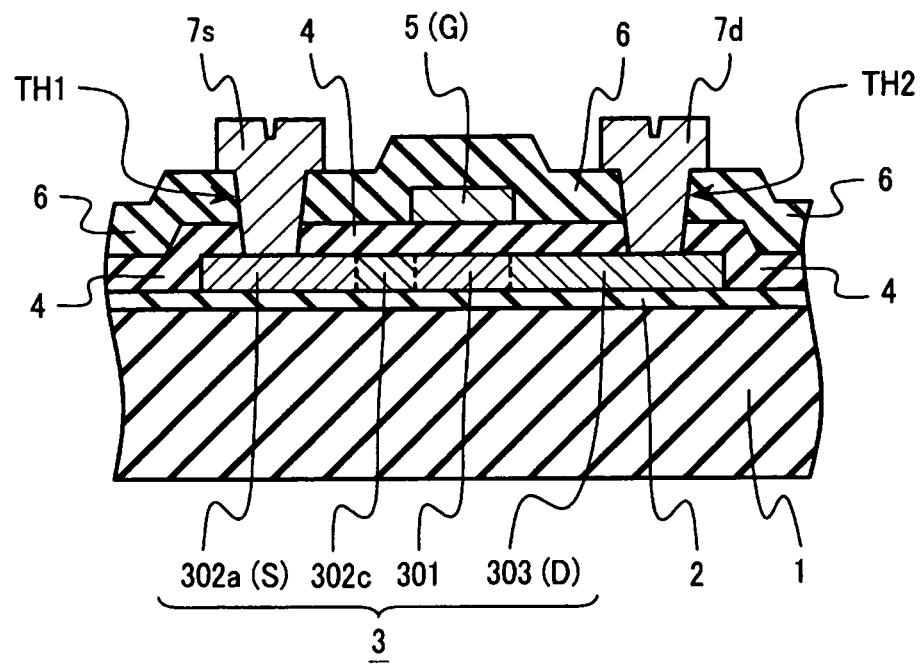
FIG. 2B is a cross sectional view taken along the line 2b-2b of FIG. 2A.
Figure 2D:
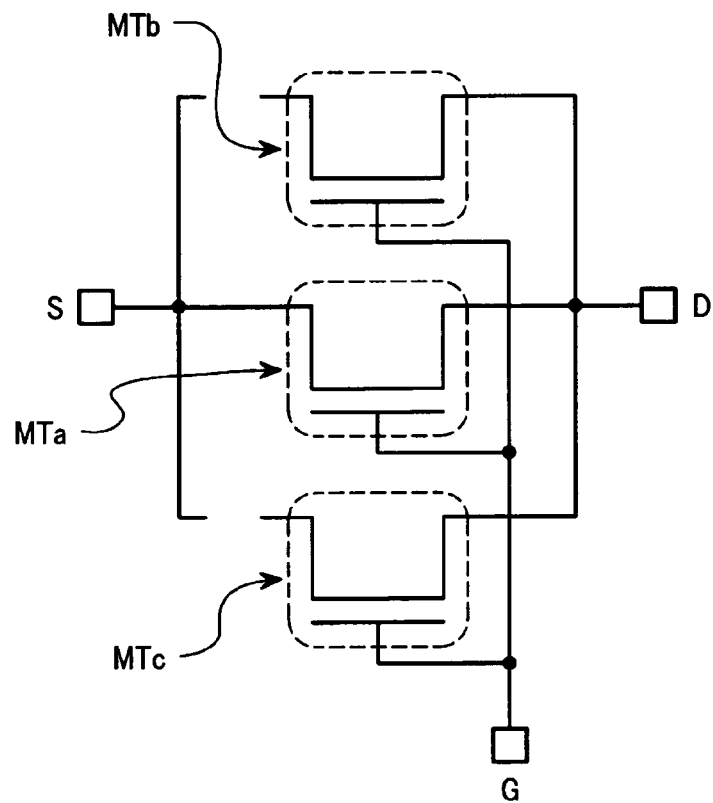
FIG. 2D is an equivalent circuit diagram showing the TFT element of FIGS. 2A to 2C.

FIG. 2A is a schematic plan view showing a structural example of a TFT element of the semiconductor device according to Embodiment 1. FIG. 2B is a cross sectional view taken along a line 2b-2b of FIG. 2A. FIG. 2C is a schematic plan view showing a structure of a semiconductor layer of FIG. 2A. FIG. 2D is an equivalent circuit diagram showing the TFT element of FIGS. 2A to 2C.

A cross sectional structure taken along the line 1b-1b of FIG. 2A corresponds to the structure as shown in FIG. 1B. A cross-sectional structure taken along the line 1c-1c of FIG. 2A corresponds to the structure as shown in FIG. 1C.

The semiconductor device according to Embodiment 1 is a device in which a plurality of top gate TFT elements each using a polycrystalline semiconductor such as polycrystalline silicon are arranged on the insulating substrate 1. Each of the TFT elements has the same fundamental structure as the TFT element shown in FIGS. 1A to 1C. That is, one of the TFT elements of the semiconductor device according to Embodiment 1 has, for example, the following structure. As shown in FIGS. 2A, 2B, 1B, and 1C, the base insulating layer 2 is formed on the surface of the insulating substrate 1. The semiconductor layer 3 made of the polycrystalline semiconductor, the first insulating film 4 serving as the gate insulating film of the TFT element, the gate electrode 5, the second insulating film 6, and the wirings 7s, 7d, and 7g are formed on the base insulating layer 2.

The TFT element related to Embodiment 1 is different from the conventional TFT element shown in FIGS. 1A to 1C in a structure of the semiconductor layer 3, in particular, a structure of the second region 302 serving as the source of the TFT element.

For example, as shown in FIGS. 2A, 2B, and 2C, the second region 302 of the semiconductor layer 3 of the TFT element related to Embodiment 1 includes three regions, that is, a first impurity diffusion region 302a serving as the source and second impurity diffusion regions 302b and 302c. In the TFT element related to Embodiment 1, the first impurity diffusion region 302a and the second impurity diffusion regions 302b and 302c are formed so as to satisfy the following conditions.

Each of the second impurity diffusion regions 302b and 302c has an opposite conductivity type to the first impurity diffusion region 302a. That is, when the TFT element related to Embodiment 1 is an nMOS transistor, the first impurity diffusion region 302a of the second region 302 is of an n-type and each of the second impurity diffusion regions 302b and 302c is of a p-type. When the TFT element related to Embodiment 1 is a pMOS transistor, the first impurity diffusion region 302a of the second region 302 is of a p-type and each of the second impurity diffusion regions 302b and 302c is of an n-type.

An impurity concentration of each of the second impurity diffusion regions 302b and 302c is desirably set to a concentration at which the second impurity diffusion regions are not depleted within a use voltage range of the TFT element. Therefore, when the TFT element related to Embodiment 1 is an nMOS transistor, the impurity concentration of each of the second impurity diffusion regions 302b and 302c is preferably set to, for example, a value equal to an impurity concentration of each of the source and the drain of a general pMOS transistor. When the TFT element related to Embodiment 1 is a pMOS transistor, the impurity concentration of each of the second impurity diffusion regions 302b and 302c is preferably set to, for example, a value equal to an impurity concentration of each of the source and the drain of a general nMOS transistor.

A boundary between the first region 301 and the second region 302 includes three portions extending in a position substantially equal in level to an end surface of the gate electrode 5. The boundary includes a portion in which the first region 301 is in contact with the first impurity diffusion region 302a, a portion in which the first region 301 is in contact with the second impurity diffusion region 302b, and a portion in which the first region 301 is in contact with the second impurity diffusion region 302c. The portion in which the first region 301 is in contact with the second impurity diffusion region 302b includes the etching end surface E1 of the semiconductor layer 3 and vicinities thereof. The portion in which the first region 301 is in contact with the second impurity diffusion region 302c includes the etching end surface E2 of the semiconductor layer 3 and vicinities thereof.

Each of the portion in which the first region 301 is in contact with the second impurity diffusion region 302b and the portion in which the first region 301 is in contact with the second impurity diffusion region 302c desirably has a length Ly in a gate width direction (channel width direction), which is larger than a length Ly' in the gate width direction, of the regions 301b and 301c of the semiconductor layer 3. Note that it is difficult to define the length Ly' of the regions 301b and 301c of the semiconductor layer 3 to a specific numeral value. Therefore, it is desirable to set the length Ly to a value larger than a gate length of a TFT element in a case where a short channel effect occurs therein. Even when the length Ly is smaller than the gate length of the TFT element in the case where the short channel effect occurs therein, an effect of the present invention in this application can be obtained.

A length Lx in a gate length direction (channel length direction), of the second impurity diffusion regions 302b and 302c is preferably set to a value at which the second impurity diffusion regions 302b and 302c are not depleted within a use voltage range of the TFT element.

The second impurity diffusion regions 302b and 302c are not connected to the wiring 7s.

In view of the position dependence of the electric field acting on the first region 301 of the semiconductor layer 3 in the TFT element related to Embodiment 1, satisfying the conditions as described above, an equivalent circuit of one TFT element can be expressed as shown in, for example, FIG. 2D. In this case, the point that one TFT element is expressed by including the single main body MOS element MTa and the two side MOS elements MTb and MTc is the same as the case of the equivalent circuit shown in FIG. 1E. However, in the TFT element related to Embodiment 1, the second impurity diffusion region 302b is interposed between the region 301b of the first region 301 and the first impurity diffusion region 302a, and the second impurity diffusion region 302c is interposed between the region 301c thereof and the first impurity diffusion region 302a. That is, the second impurity diffusion region 302b (302c) is located on the source side of the side MOS element MTb (MTc) and has a polarity in which carriers of the side MOS element MTb (MTc) are minority carriers, and hence the second impurity diffusion region 302b (302c) serves as a barrier against the carriers. Therefore, the source side of each of the side MOS elements MTb and MTc is in an open state in view of the equivalent circuit.

Thus, even when the TFT element related to Embodiment 1 is, for example, of the enhancement type and the threshold voltage Vth of each of the side MOS elements MTb and MTc is shifted to the depletion side with respect to the threshold voltage Vth of the main body MOS element MTa, a leak current does not flow through the side MOS elements MTb and MTc while the TFT element is in the off-state.

While the TFT element related to Embodiment 1 is in the on-state, only a current flowing through the source of the main body MOS element MTa flows into the side MOS elements MTb and MTc. Therefore, the current does not start to flow into the side MOS elements MTb and MTc before the main body MOS element MTa is turned on.

That is, the side MOS elements MTb and MTc of the TFT element related to Embodiment 1 do not serve as transistors while the TFT element is in the off-state. While the TFT element is in the on-state, the current flowing through the side MOS elements MTb and MTc is suppressed from affecting a current flowing through the entire TFT element. As a result, a variation in conduction current or on-resistance can be reduced while the TFT element is in the on-state. The leak current can be prevented from flowing while the TFT element is in the off-state.

The TFT element related to Embodiment 1 can be produced by, for example, the same procedure as the production procedure of the conventional TFT element shown in FIGS. 1A to 1C. That is, the semiconductor layer 3, the first insulating film 4, and the gate electrode 5 are formed. After that, for example, the first impurity diffusion region 302a serving as one of the source and the drain and the second impurity diffusion regions 302b and 302c are preferably formed in a process for implanting impurities into the second region 302 and the third region 303 of the semiconductor layer 3.

When the TFT element related to Embodiment 1 is to be produced, for example, the second impurity diffusion regions 302b and 302c satisfying the conditions described above are preferably formed in the second region 302 of the semiconductor layer 3. Therefore, for example, even when the gate electrode 5 is not formed into a specific two-dimensional shape unlike the transistor disclosed in JP 08-160469 A, the effect described above can be obtained. As a result, when a semiconductor device in which a plurality of TFT elements are arranged on the insulating substrate 1 is to be produced, an occupied area of each of the TFT elements can be prevented from increasing. Thus, when the semiconductor device in which the plurality of TFT elements are arranged on the insulating substrate 1 is to be produced, a region necessary to form circuits can be prevented from expanding.

Embodiment 2

Figure 3A:
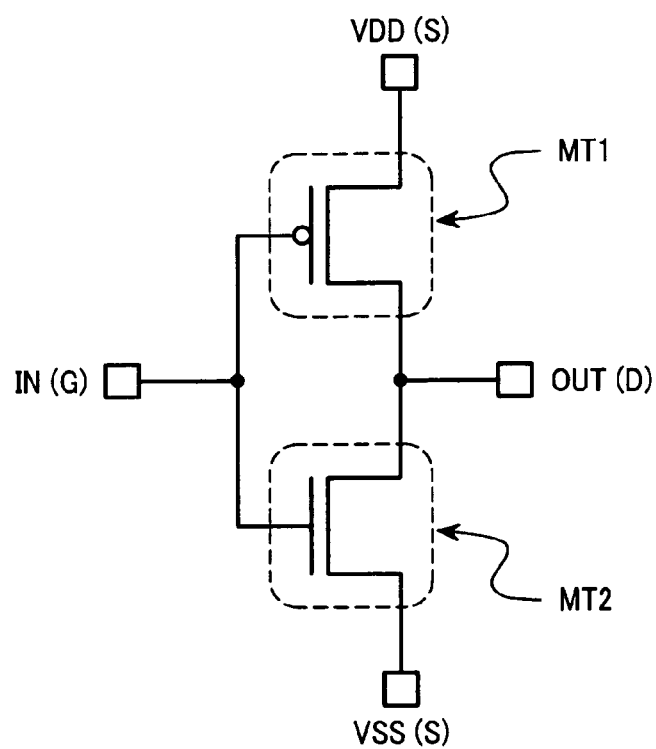
FIG. 3A is an equivalent circuit diagram showing a CMOS inverter circuit.
Figure 3B:
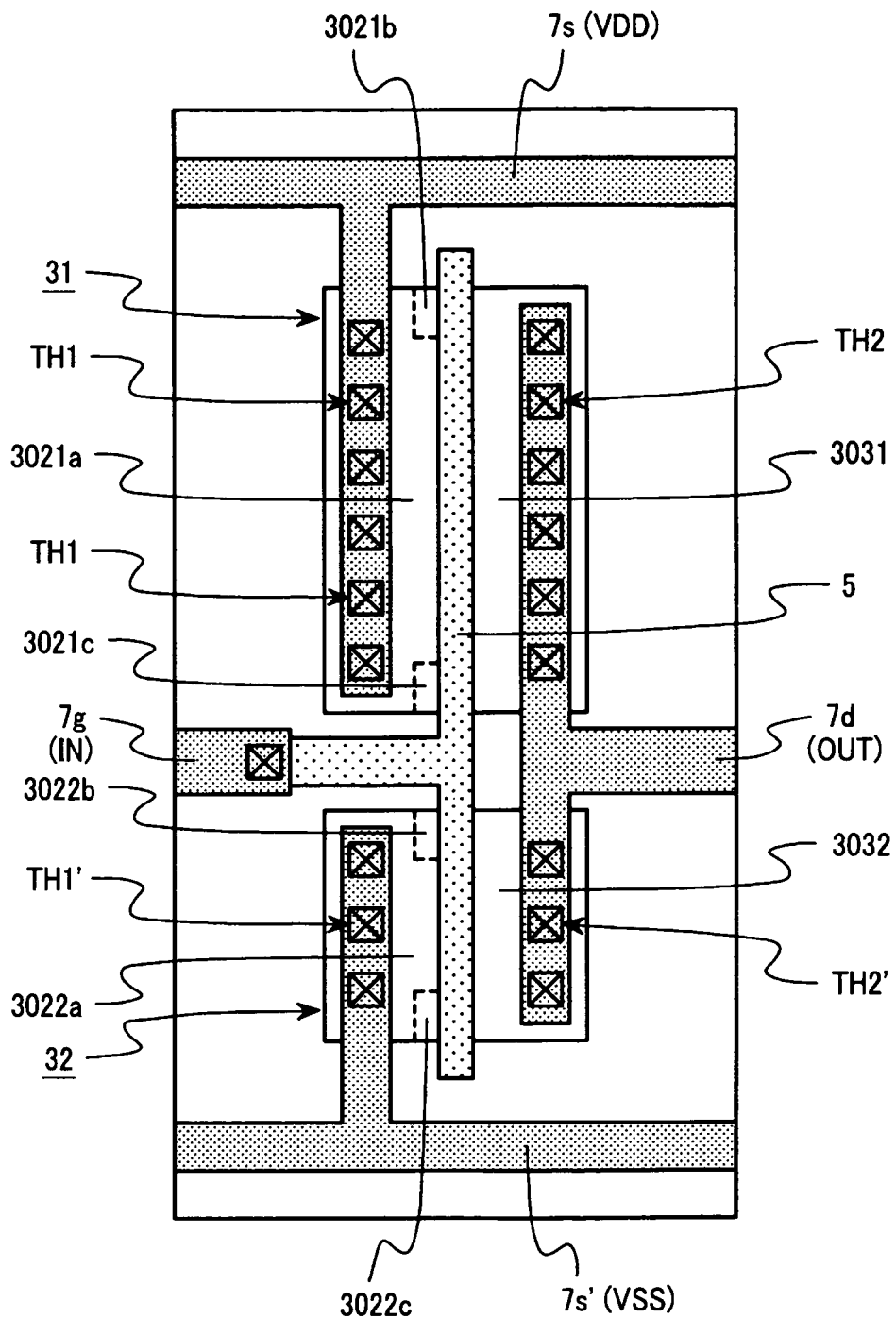
FIG. 3B is a schematic plan view showing a structural example of the CMOS inverter circuit in a semiconductor device according to Embodiment 2 of the present invention.

FIGS. 3A and 3B are schematic diagram and view showing a general structure of a semiconductor device according to Embodiment 2 of the present invention.

FIG. 3A is an equivalent circuit diagram showing a CMOS inverter circuit. FIG. 3B is a schematic plan view showing a structural example of the CMOS inverter circuit in the semiconductor device according to Embodiment 2.

A semiconductor device in which a plurality of TFT elements are arranged on the insulating substrate 1 includes, for example, a complementary inverter circuit (CMOS inverter circuit) in which a PMOS transistor and an nMOS transistor, each of which is of the enhancement type, are connected in series. An equivalent circuit of the CMOS inverter circuit is expressed as shown in, for example, FIG. 3A and has an input terminal IN(G) connected with gates of a pMOS transistor MT1 and an nMOS transistor MT2 and an output terminal OUT(D) connected with drains (D) of the pMOS transistor MT1 and the nMOS transistor MT2. A source (S) of the PMOS transistor MT1 is connected to a power supply terminal VDD(S). A source (S) of the nMOS transistor MT2 is connected to a ground terminal VSS(S).

A two-dimensional layout of each of the pMOS transistor MT1 and the nMOS transistor MT2 in the conventional CMOS inverter circuit is made as shown in, for example, FIGS. 1A to 1C. An equivalent circuit of each of the pMOS transistor MT1 and the nMOS transistor MT2 is made as shown in, for example, FIG. 1D. Therefore, because of the presence of the side MOS elements, each of the pMOS transistor MT1 and the nMOS transistor MT2 in the conventional CMOS inverter circuit has the problem that the leak current flows during the off-state and the problem that the conduction current or the on-resistance varies during the on-state.

In order to prevent the problems as described above from occurring in the CMOS inverter circuit, a two-dimensional layout of the CMOS inverter circuit formed on the insulating substrate 1 is preferably made as shown in, for example, FIG. 3B. As shown in FIG. 3B, the CMOS inverter circuit includes a semiconductor layer 31 of the PMOS transistor MT1 and a semiconductor layer 32 of the nMOS transistor MT2.

A region of the semiconductor layer 31 of the pMOS transistor MT1 which overlaps with the gate electrode 5 as viewed in plan corresponds to a first region in which a channel is formed. A region of the semiconductor layer 31 which is located on the left side of the first region (gate electrode 5) corresponds to a second region 3021 which includes a first impurity diffusion region 3021a serving as the source and second impurity diffusion regions 3021b and 3021c. A region of the semiconductor layer 31 which is located on the right side of the first region (gate electrode 5) corresponds to a third region 3031. The entire third region 3031 has the same conductivity type as the first impurity diffusion region 3021a and equal in concentration to the first impurity diffusion region 3021a. The first impurity diffusion region 3021a of the second region 3021 is connected to a wiring 7s (VDD) through through-holes TH1. The third region 3031 is connected to a wiring 7d (OUT) through through-holes TH2.

A region of the semiconductor layer 32 of the nMOS transistor MT2 which overlaps with the gate electrode 5 as viewed in plan corresponds to a first region in which a channel is formed. A region of the semiconductor layer 32 which is located on the left side of the first region (gate electrode 5) corresponds to a second region 3022 which includes a first impurity diffusion region 3022a serving as the source and second impurity diffusion regions 3022b and 3022c. A region of the semiconductor layer 32 which is located on the right side of the first region (gate electrode 5) corresponds to a third region 3032. The entire third region 3032 has the same conductivity type as the first impurity diffusion region 3022a and equal in concentration to the first impurity diffusion region 3022a. The first impurity diffusion region 3022a of the second region 3022 is connected to a wiring 7s' (VSS) through through-holes TH1'. The third region 3032 is connected to the wiring 7d (OUT) through through-holes TH2'.

Although the detailed description is omitted, each of the pMOS transistor MT1 and the nMOS transistor MT2 has the cross sectional structure as shown in FIG. 2B or FIGS. 1B and 1C.

Although the detailed description is omitted, the first impurity diffusion region 3021a and the second impurity diffusion regions 3021b and 3021c in the second region 3021 of the semiconductor layer 31 of the PMOS transistor MT1, and the first impurity diffusion region 3022a and the second impurity diffusion regions 3022b and 3022c in the second region 3022 of the semiconductor layer 32 of the nMOS transistor MT2 each are formed so as to satisfy the conditions as described in Embodiment 1.

As described above, each of the semiconductor layer 31 of the pMOS transistor MT1 and the semiconductor layer 32 of the nMOS transistor MT2 which are used to form the CMOS inverter circuit is formed to have the structure as described in Embodiment 1. Therefore, in each of the pMOS transistor MT1 and the nMOS transistor MT2 in the CMOS inverter circuit, a variation in conduction current or on-resistance can be reduced during the on-state and the leak current can be prevented from flowing during the off-state.

In Embodiment 2, the second impurity diffusion region is provided in each of the pMOS transistor MT1 and the nMOS transistor MT2 which serve as the CMOS inverter circuit. However, the present invention is not limited thereto. For example, the second impurity diffusion region may be provided in any one of the PMOS transistor MT1 and the nMOS transistor MT2. That is, when, of the pMOS transistor MT1 and the nMOS transistor MT2, for example, the pMOS transistor MT1 includes the side MOS elements with a leak current which does not cause a problem on the operation of the pMOS transistor MT1, the second impurity diffusion regions are provided in only the nMOS transistor MT2, and hence the same effect as the CMOS inverter circuit of Embodiment 2 can be obtained. In contrast to this, when, of the PMOS transistor MT1 and the nMOS transistor MT2, for example, the nMOS transistor MT2 includes the side MOS elements with a leak current which does not cause a problem on the operation of the nMOS transistor MT2, the second impurity diffusion regions are provided in only the pMOS transistor MT1, and hence the same effect as the CMOS inverter circuit of Embodiment 2 can be obtained.

Embodiment 3

Figure 4A:
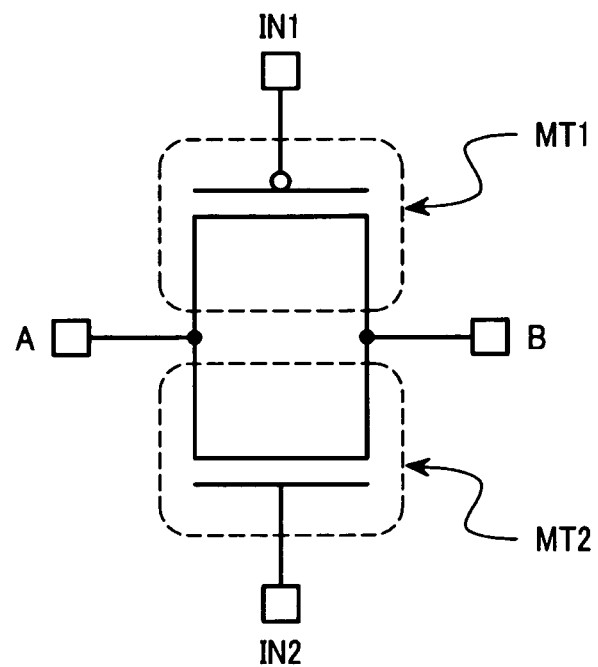
FIG. 4A is an equivalent circuit diagram showing an analog switch circuit.
Figure 4B:
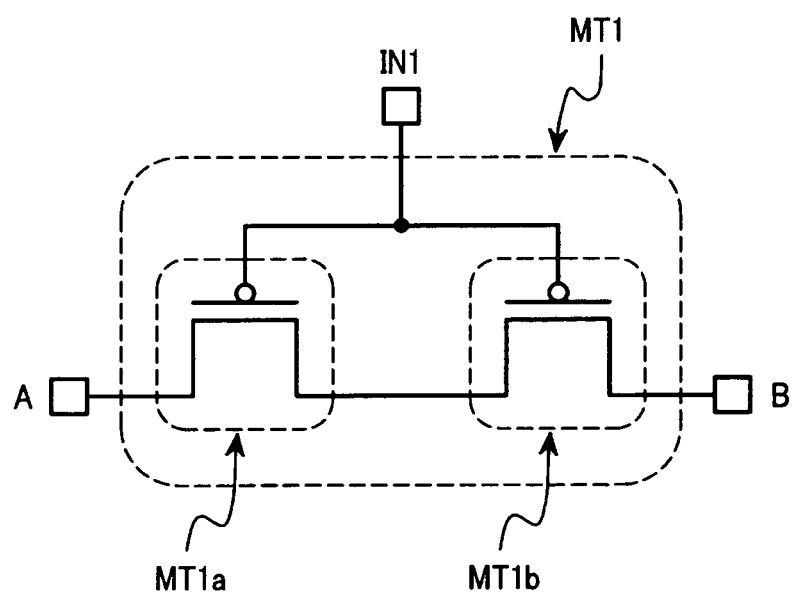
FIG. 4B is an equivalent circuit diagram showing a pMOS transistor having a dual gate structure.
Figure 4C:
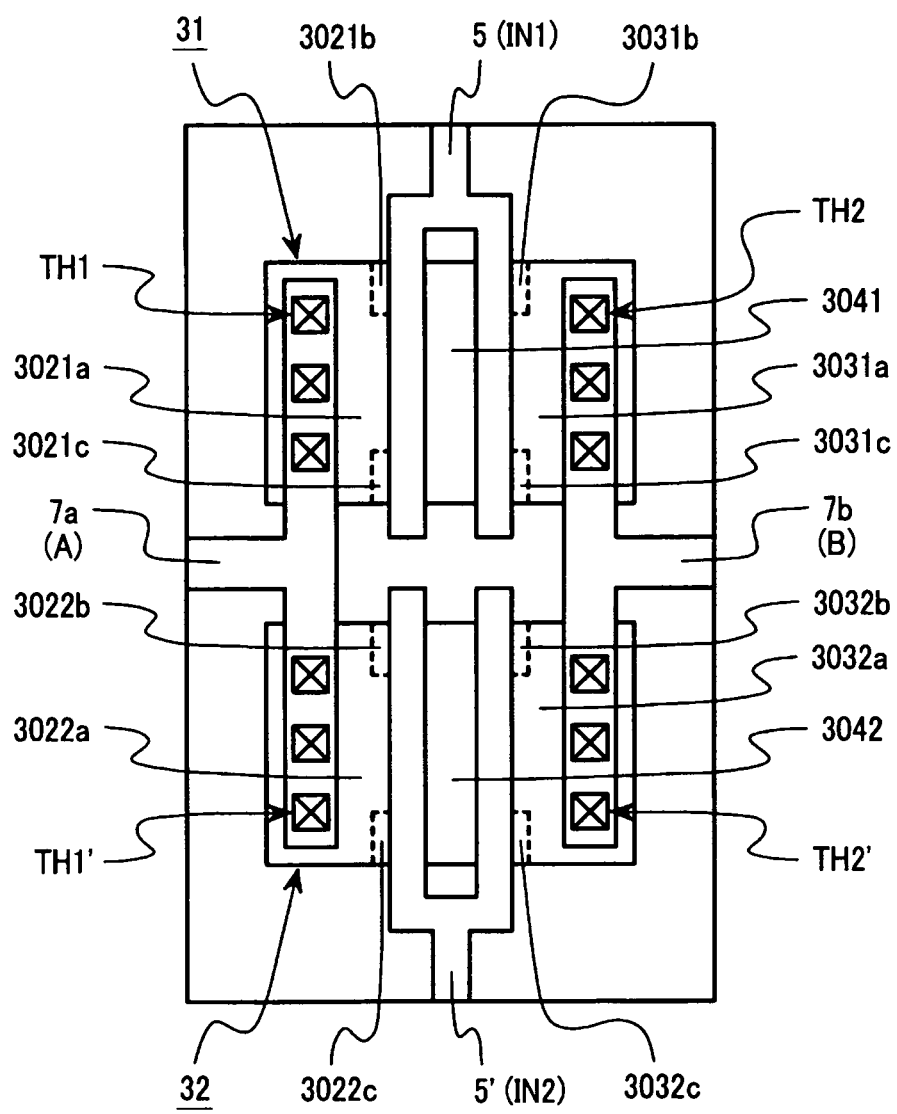
FIG. 4C is a schematic plan view showing a structural example of the analog switch circuit in a semiconductor device according to Embodiment 3 of the present invention.

FIGS. 4A to 4C are schematic diagrams and view showing a general structure of a semiconductor device according to Embodiment 3 of the present invention.

FIG. 4A is an equivalent circuit diagram showing an analog switch circuit. FIG. 4B is an equivalent circuit diagram showing a pMOS transistor having a dual gate structure. FIG. 4C is a schematic plan view showing a structural example of the analog switch circuit in the semiconductor device according to Embodiment 3.

In Embodiment 2, the example of the circuit including the pMOS transistor and the nMOS transistor, each of whose source and drain are fixed, is the CMOS inverter circuit. However, some semiconductor device have a circuit including the PMOS transistor and the nMOS transistor, each of whose source and drain are interchanged as needed. In Embodiment 3, an example of the circuit including the pMOS transistor and the nMOS transistor, each of whose source and drain are interchanged as needed, is the analog switch circuit. A structural example of the analog switch circuit to which the present invention is applied is described.

The analog switch circuit is expressed as, for example, an equivalent circuit as shown in FIG. 4A. A gate of the pMOS transistor MT1 is connected to a first input terminal IN1. A gate of the nMOS transistor MT2 is connected to a second input terminal IN2. One of a source and a drain of the pMOS transistor MT1 is connected to a terminal A and the other thereof is connected to a terminal B. One of a source and a drain of the nMOS transistor MT2 is connected to the terminal A and the other thereof is connected to the terminal B.

In the analog switch circuit described above, signals inverted to each other are inputted to the respective input terminals IN1 and IN2. For example, when the pMOS transistor MT1 and the nMOS transistor MT2 are simultaneously turned on or off, electrical connection and electrical disconnection between the terminal A and the terminal B are switched therebetween. For example, due to a voltage difference between the terminal A and the terminal B when each of the pMOS transistor MT1 and the nMOS transistor MT2 is in the on-state, there are a case where the terminal A side acts as the source and the terminal B side acts as the drain and a case where the terminal A side acts as the drain and the terminal B side acts as the source.

As described above, in the case of the TFT elements (MOS transistors), each of whose source and drain are interchanged as needed, it is necessary to realize a symmetrical relationship between the source and the drain with respect to the gate electrode.

Therefore, when the present invention is applied to the pMOS transistor MT1 and the nMOS transistor MT2 of the analog switch circuit, it is necessary to produce each of the pMOS transistor MT1 and the nMOS transistor MT2 to have, for example, the dual gate structure. The pMOS transistor MT1 having the dual gate structure is expressed by, for example, the equivalent circuit as shown in FIG. 4B. In this equivalent circuit, gates of two pMOS transistors MT1a and MT1b are connected to the input terminal IN1. When there is a relationship in which the terminal A corresponds to the source and the terminal B corresponds to the drain, the terminal A side of the pMOS transistor MT1a acts as the source and the terminal B side of the PMOS transistor MT1b acts as the drain, and hence a state is obtained in which a drain of the pMOS transistor MT1a is connected to a source of the pMOS transistor MT1b. On the other hand, when there is a relationship in which the terminal A corresponds to the drain and the terminal B corresponds to the source, the terminal A side of the pMOS transistor MT1a acts as the drain and the terminal B side of the pMOS transistor MT1b acts as the source, and hence a state is obtained in which a source of the pMOS transistor MT1a is connected to a drain of the pMOS transistor MT1b.

When the present invention is applied to the analog switch circuit including the pMOS transistor and the nMOS transistor each having the dual gate structure as described above, a two-dimensional layout of the analog switch circuit is preferably made as shown in, for example, FIG. 4C. As shown in FIG. 4C, the analog switch circuit includes the semiconductor layer 31 of the pMOS transistor MT1 and the semiconductor layer 32 of the nMOS transistor MT2.

Two regions of the semiconductor layer 31 of the pMOS transistor MT1 which overlap with the gate electrode 5 as viewed in plan correspond to two first regions. Of three regions obtained by dividing the semiconductor layer 31 by the two first regions, a region located on the leftmost side corresponds to the second region 3021, a region located on the rightmost side corresponds to the third region 3031, a region sandwiched between the two first regions corresponds to a fourth region 3041. The second region 3021 includes the first impurity diffusion region 3021a serving as one of the source and the drain and the second impurity diffusion regions 3031b and 3031c. The third region 3031 of the semiconductor layer 31 includes the first impurity diffusion region 3031a serving as one of the drain and the source depending on the function of the first impurity diffusion region 3021a, and the second impurity diffusion regions 3031b and 3031c. The first impurity diffusion region 3021a of the second region 3021 is connected to a wiring 7a (terminal A) through the through-holes TH1. The first impurity diffusion region 3031a of the third region 3031 is connected to a wiring 7b (terminal B) through the through-holes TH2.

Although the detailed description is omitted, the first impurity diffusion region 3021a and the second impurity diffusion regions 3021b and 3021c in the second region 3021 of the semiconductor layer 31 of the pMOS transistor MT1, and the first impurity diffusion region 3031a and the second impurity diffusion regions 3031b and 3031c in the third region 3031 thereof each are formed so as to satisfy the conditions as described in Embodiment 1.

In a case where the pMOS transistor MT1 of the analog switch circuit has the structure as described above, when the first impurity diffusion region 3021a of the second region 3021 is the source and the first impurity diffusion region 3031a of the third region 3031 is the drain, the second impurity diffusion regions 3021b and 3021c in the second region 3021 serve as barriers, and hence the leak current can be prevented from flowing. In contrast to this, when the first impurity diffusion region 3021a of the second region 3021 is the drain and the first impurity diffusion region 3031a of the third region 3031 is the source, the second impurity diffusion regions 3031b and 3031c of the third region 3031 serve as barriers, and hence the leak current can be prevented from flowing.

Two regions of the semiconductor layer 32 of the nMOS transistor MT2 which overlap with a gate electrode 5' as viewed in plan correspond to two first regions. Of three regions obtained by dividing the semiconductor layer 32 by the two first regions, a region located on the leftmost side corresponds to the second region 3022, a region located on the rightmost side corresponds to the third region 3032, a region sandwiched between the two first regions corresponds to a fourth region 3042. The second region 3022 includes the first impurity diffusion region 3022a serving as one of the source and the drain and the second impurity diffusion regions 3022b and 3022c. The third region 3032 of the semiconductor layer 32 includes a first impurity diffusion region 3032a serving as one of the drain and the source depending on the function of the first impurity diffusion region 3022a, and second impurity diffusion regions 3032b and 3032c. The first impurity diffusion region 3022a of the second region 3022 is connected to the wiring 7a (terminal A) through the through-holes TH1'. The first impurity diffusion region 3032a of the third region 3032 is connected to the wiring 7b (terminal B) through the through-holes TH2'.

Although the detailed description is omitted, the first impurity diffusion region 3022a and the second impurity diffusion regions 3022b and 3022c in the second region 3022 of the semiconductor layer 32 of the nMOS transistor MT2, and the first impurity diffusion region 3032a and the second impurity diffusion regions 3032b and 3032c in the third region 3032 thereof each are formed so as to satisfy the conditions as described in Embodiment 1.

In a case where the nMOS transistor MT2 of the analog switch circuit has the structure as described above, when the first impurity diffusion region 3022a of the second region 3022 is the source and the first impurity diffusion region 3032a of the third region 3032 is the drain, the second impurity diffusion regions 3022b and 3022c in the second region 3022 serve as barriers, and hence the leak current can be prevented from flowing. In contrast to this, when the first impurity diffusion region 3022a of the second region 3022 is the drain and the first impurity diffusion region 3032a of the third region 3032 is the source, the second impurity diffusion regions 3032b and 3032c of the third region 3032 serve as barriers, and hence the leak current can be prevented from flowing.

As described above, the semiconductor layer 31 of the PMOS transistor MT1 and the semiconductor layer 32 of the nMOS transistor MT2 which are used to produce the complementary analog switch circuit are formed as shown in FIG. 4C. Therefore, the variation in conduction current or on-resistance can be reduced in each of the pMOS transistor MT1 and the nMOS transistor MT2 of the complementary analog switch circuit during the on-state. In addition, the leak current can be prevented from flowing in each of the pMOS transistor MT1 or the nMOS transistor MT2 during the off-state.

Figure 5A:
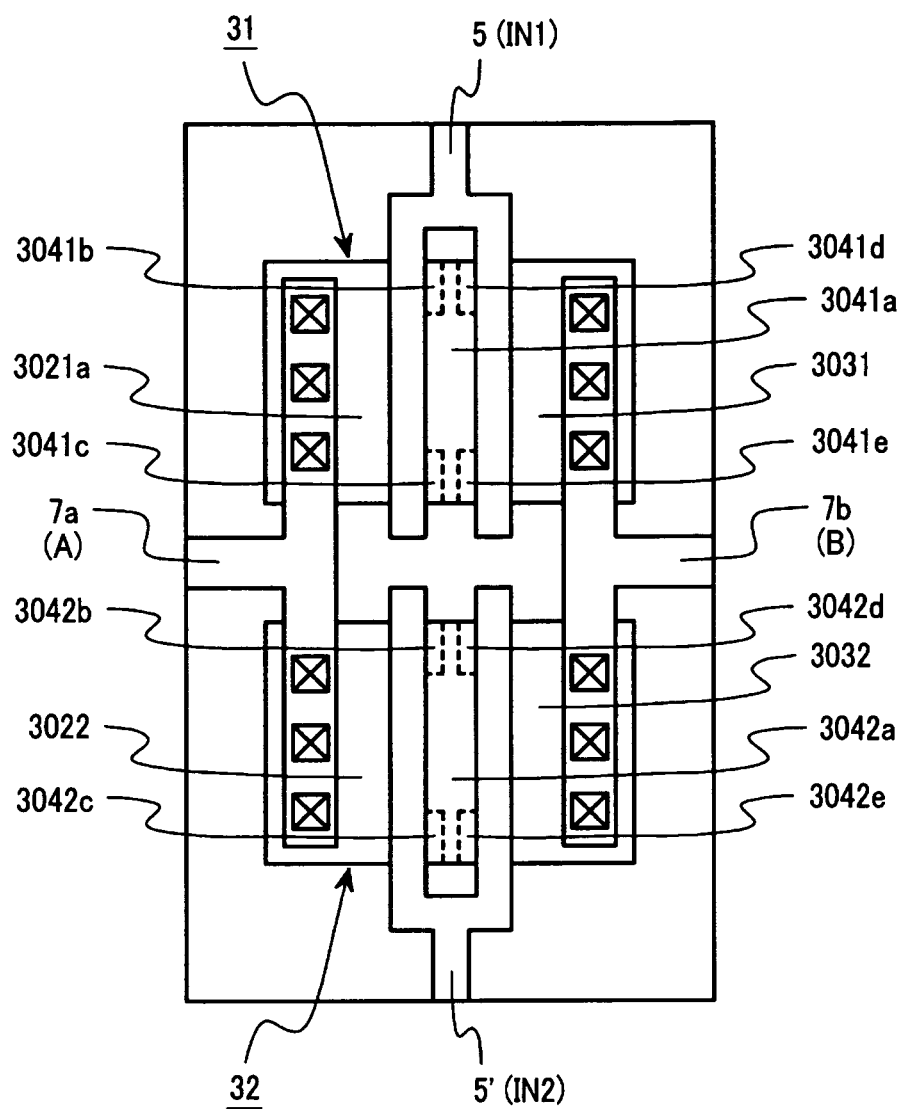
FIG. 5A is a schematic plan view showing a first modified example of the analog switch circuit of Embodiment 3 of the present invention.
Figure 5B:
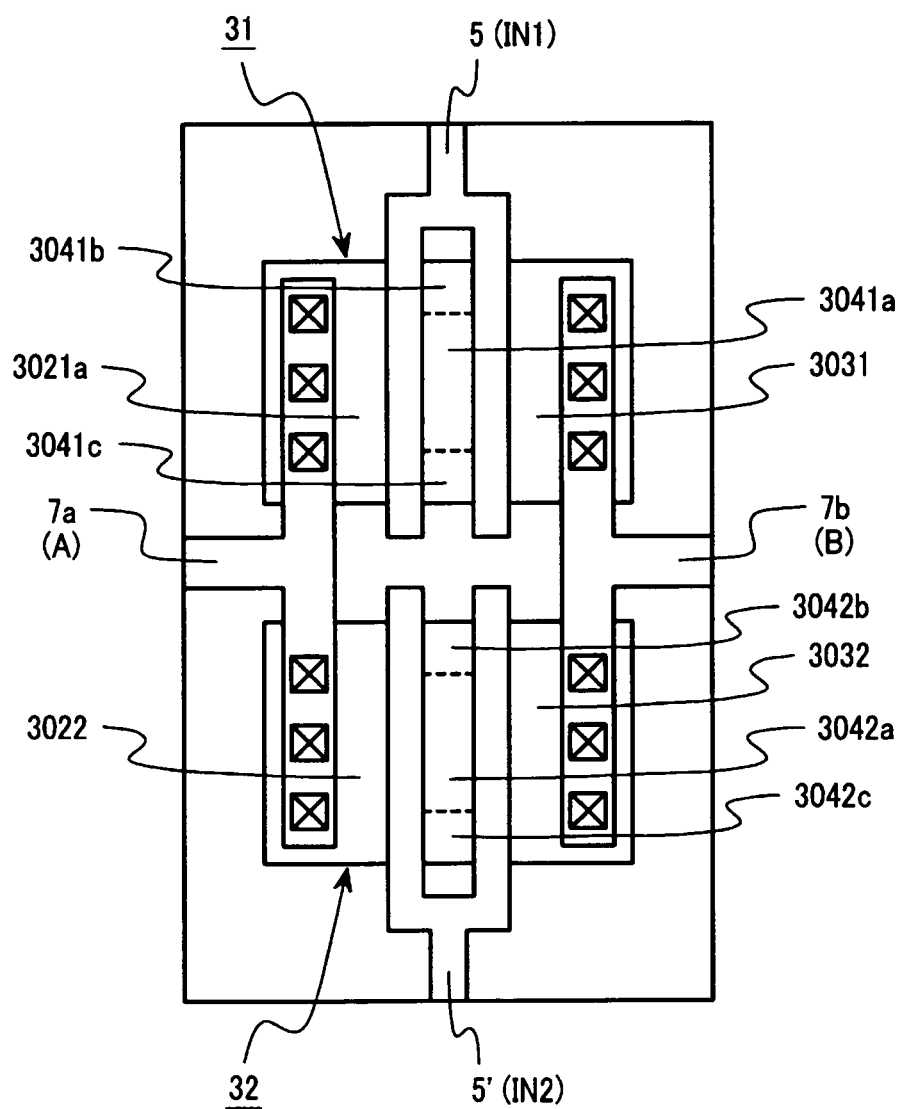
FIG. 5B is a schematic plan view showing a second modified example of the analog switch circuit of Embodiment 3 of the present invention.

FIG. 5A is a schematic plan view showing a first modified example of the analog switch circuit of Embodiment 3. FIG. 5B is a schematic plan view showing a second modified example of the analog switch circuit of Embodiment 3.

The structural example of the analog switch circuit to which the present invention is applied is, as shown in FIG. 4C, the structure in which each of the pMOS transistor MT1 and the nMOS transistor MT2 has the dual gate structure and the second impurity diffusion regions are provided in each of the second region and the third region in the semiconductor layers 31 and 32 of the respective MOS transistors.

However, in the case of the analog switch circuit in which the pMOS transistor MT1 and the nMOS transistor MT2 each having the dual gate structure are combined as described in Embodiment 3, areas in which the second impurity diffusion regions are provided are not limited to the second region and the third region in the semiconductor layers 31 and 32 of the respective MOS transistors. For example, as shown in FIG. 5A, the second impurity diffusion regions may be provided in the fourth regions 3041 and 3042.

In this case, each of the entire second region 3021 and the entire third region 3031 of the semiconductor layer 31 of the pMOS transistor MT1 corresponds to the first impurity diffusion region (p-type region). The fourth region 3041 includes a first impurity diffusion region 3041a and four second impurity diffusion regions 3041b, 3041c, 3041d, and 3041e. The second impurity diffusion regions 3041b, 3041c, 3041d, and 3041e of the fourth region 3041 are formed so as to satisfy the same conditions as described in Embodiment 1.

In addition, each of the entire second region 3022 and the entire third region 3032 of the semiconductor layer 32 of the nMOS transistor MT2 corresponds to the first impurity diffusion region (n-type region). The fourth region 3042 includes a first impurity diffusion region 3042a and four second impurity diffusion regions 3042b, 3042c, 3042d, and 3042e. The second impurity diffusion regions 3042b, 3042c, 3042d, and 3042e of the fourth region 3042 are formed so as to satisfy the same conditions as described in Embodiment 1.

For example, when the second impurity diffusion regions are to be formed in the fourth region 3041 of the pMOS transistor MT1, as shown in FIG. 5B, the fourth region 3041 of the pMOS transistor MT1 may include the first impurity diffusion region 3041a and the two second impurity diffusion regions 3041b and 3041c. In this case, the fourth region 3042 of the nMOS transistor MT2 may similarly include the first impurity diffusion region 3042a and the two second impurity diffusion regions 3042b and 3042c.

In the examples shown in FIGS. 4C, 5A and 5B, the second impurity diffusion regions of the pMOS transistor MT1 and the second impurity diffusion regions of the nMOS transistor MT2 are formed in the same areas of the semiconductor layers 31 and 32 of the respective MOS transistors. However, the present invention is not limited thereto. For example, the second impurity diffusion regions of the pMOS transistor MT1 can be formed in the positions as shown in FIG. 4C and the second impurity diffusion regions of the nMOS transistor MT2 can be formed in the positions as shown in FIG. 5A.

In the case of the analog switch circuit of Embodiment 3, the second impurity diffusion regions are provided in each of the pMOS transistor MT1 and the nMOS transistor MT2. However, the present invention is not limited thereto. The second impurity diffusion regions may be provided in only any one of the pMOS transistor MT1 and the nMOS transistor MT2.

Embodiment 4

Figure 6A:
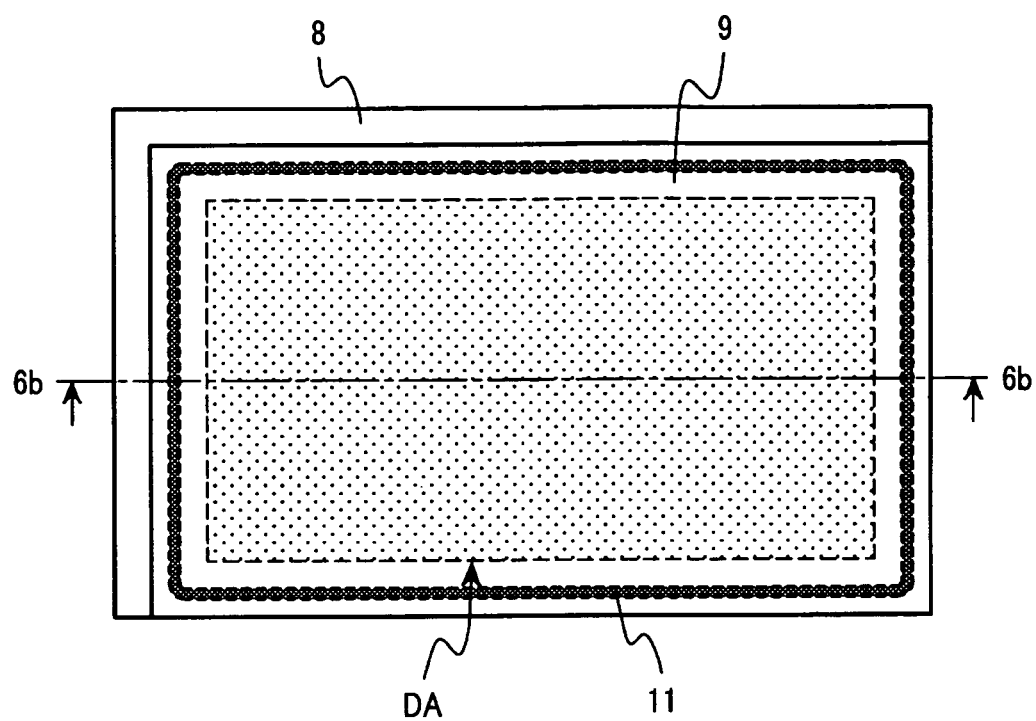
FIG. 6A is a schematic plan view showing an example of a general structure of a liquid crystal display panel.
Figure 6B:
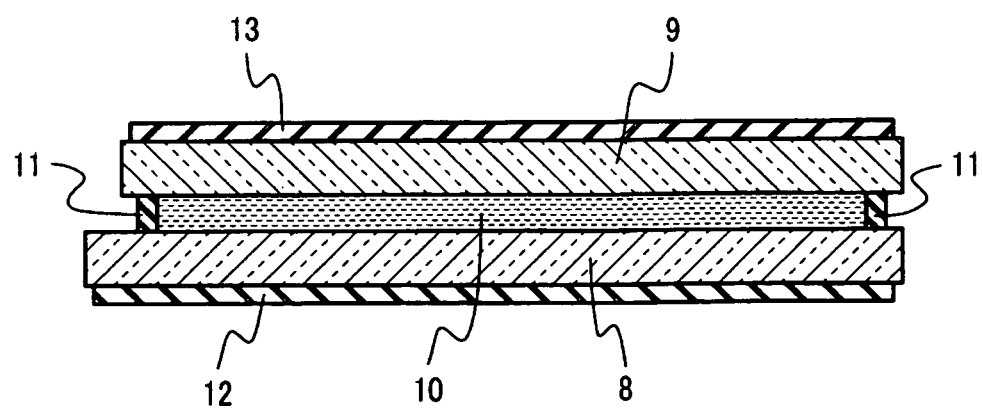
FIG. 6B is a cross sectional view taken along the line 6b-6b of FIG. 6A.
Figure 6C:
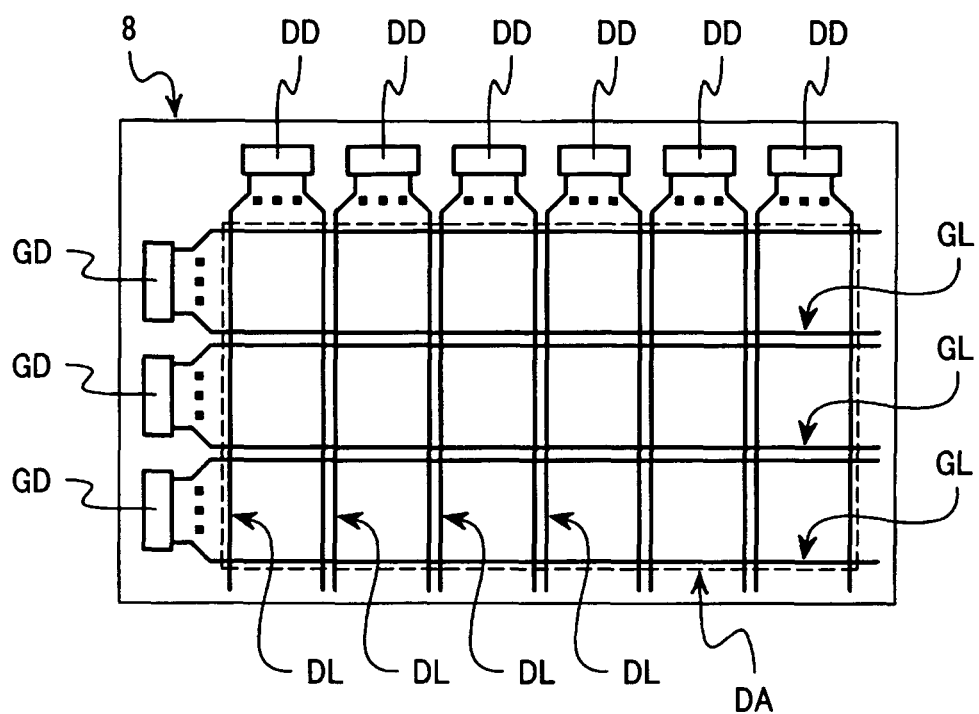
FIG. 6C is a schematic plan view showing a structural example of a TFT substrate shown in FIG. 6A.

FIGS. 6A to 6C are schematic views showing a general structure of a semiconductor device (liquid crystal display panel) to which the present invention can be applied. FIG. 6A is a schematic plan view showing an example of the general structure of the liquid crystal display panel. FIG. 6B is a cross sectional view taken along a line 6b-6b of FIG. 6A. FIG. 6C is a schematic plan view showing a structural example of a TFT substrate shown in FIG. 6A.

The present invention can be applied to, of conventional semiconductor devices, for example, any semiconductor device using the TFT element which has the structure as shown in FIGS. 2A and 2B or FIGS. 1B and 1C and includes the semiconductor layer 3 made of a polycrystalline semiconductor, irrespective of the intended purpose.

In Embodiment 4, the structure of the TFT liquid crystal display panel which is an example of the semiconductor device including the TFT element or the circuit as described in Embodiments 1 to 3 is briefly described.

As shown in FIGS. 6A and 6B, the TFT liquid crystal display panel is, for example, a display panel in which a liquid crystal material 10 is sealingly filled between a pair of substrates (TFT substrate 8 and opposite substrate 9). The substrate 8 and the opposite substrate 9 are bonded to each other by a ring-shaped sealing material 11 provided outside a display area DA. The liquid crystal material 10 is sealed in a space surrounded by the TFT substrate 8, the opposite substrate 9, and the sealing material 11.

When the TFT liquid crystal display panel is, for example, of a transmission type or a semi-transmission type, a lower polarizing plate 12 is provided on a surface of the TFT substrate 8 which faces an outside and an upper polarizing plate 13 is provided on a surface of the opposite substrate 9 which faces an outside. A phase difference plate of at least one layer may be provided each of between the TFT substrate 8 and the lower polarizing plate 12 and between the opposite substrate 9 and the upper polarizing plate 13. When the TFT liquid crystal display panel is of a reflection type, the lower polarizing plate 12 is normally unnecessary.

As shown in FIG. 6C, the TFT substrate 8 includes, for example, a plurality of scanning signal lines GL and a plurality of video signal lines DL. The scanning signal lines GL and the video signal lines DL are provided through an insulating layer. For example, although not shown, the display area DA is set as a group of pixels each having a TFT element serving as a switching element and a pixel electrode connected to a source electrode or a drain electrode of the TFT element.

In recent years, for example, as shown in FIG. 6C, there is a liquid crystal display panel in which first driver circuits GD and second driver circuits DD are formed outside of the display area DA of the TFT substrate 8. The first driver circuits GD are integrated circuits for performing, for example, on/off control of scanning signals to be applied to the respective scanning signal lines GL. The second driver circuits DD are integrated circuits, for example, for generating video signals and for controlling application timings of video signals to be applied to the respective video signal lines DL.

In many conventional liquid crystal display panels, the first driver circuits GD and the second driver circuits DD are, for example, IC chips manufactured in a process different from a process for the TFT substrate. In the case of the TFT substrate 8 shown in FIG. 6C, the first driver circuits GD and the second driver circuits DD are formed together with, for example, the scanning signal lines GL, the video signal lines DL, and switching elements (TFT elements) and incorporated in the TFT substrate 8.

The first driver circuits GD and the second driver circuits DD are circuits in which TFT elements, resistor elements, capacitor elements, and the like (not shown) are integrated. The TFT elements for the first driver circuits GD and the second driver circuits DD should be operated at significantly higher speed than the TFT elements (switching elements) arranged in the display area. Therefore, a semiconductor layer of each of the TFT elements for the first driver circuits GD and the second driver circuits DD is desirably made of a polycrystalline semiconductor such as polycrystalline silicon.

The TFT substrate 8 includes, for example, the scanning signal lines GL, the video signal lines DL, and the TFT elements, which are formed above the insulating substrate 1 having a high light transmittance, such as a glass substrate. When the polycrystalline semiconductor layer serving as the semiconductor layer of the TFT element is to be obtained, for example, an amorphous semiconductor film (such as amorphous silicon film) formed over the insulating substrate 1 is crystallized after being melt and then etched. Therefore, when the TFT element using the polycrystalline semiconductor is to be formed in the TFT substrate 8, the TFT element desirably has the top gate structure.

Therefore, when the first driver circuits GD and the second driver circuits DD are to be incorporated in the TFT substrate 8, for example, circuits in which the TFT element described in Embodiment 1, the CMOS inverter circuit described in Embodiment 2, and the analog switch circuit described in Embodiment 3 are integrated are used as the first driver circuits GD and the second driver circuits DD. When such circuits are used, for example, the first driver circuits GD and the second driver circuits DD can be prevented from malfunctioning.

FIGS. 7A to 7C and FIGS. 8A and 8B are schematic explanatory views showing an application example of the TFT liquid crystal display panel according to Embodiment 4.

Figure 7A:
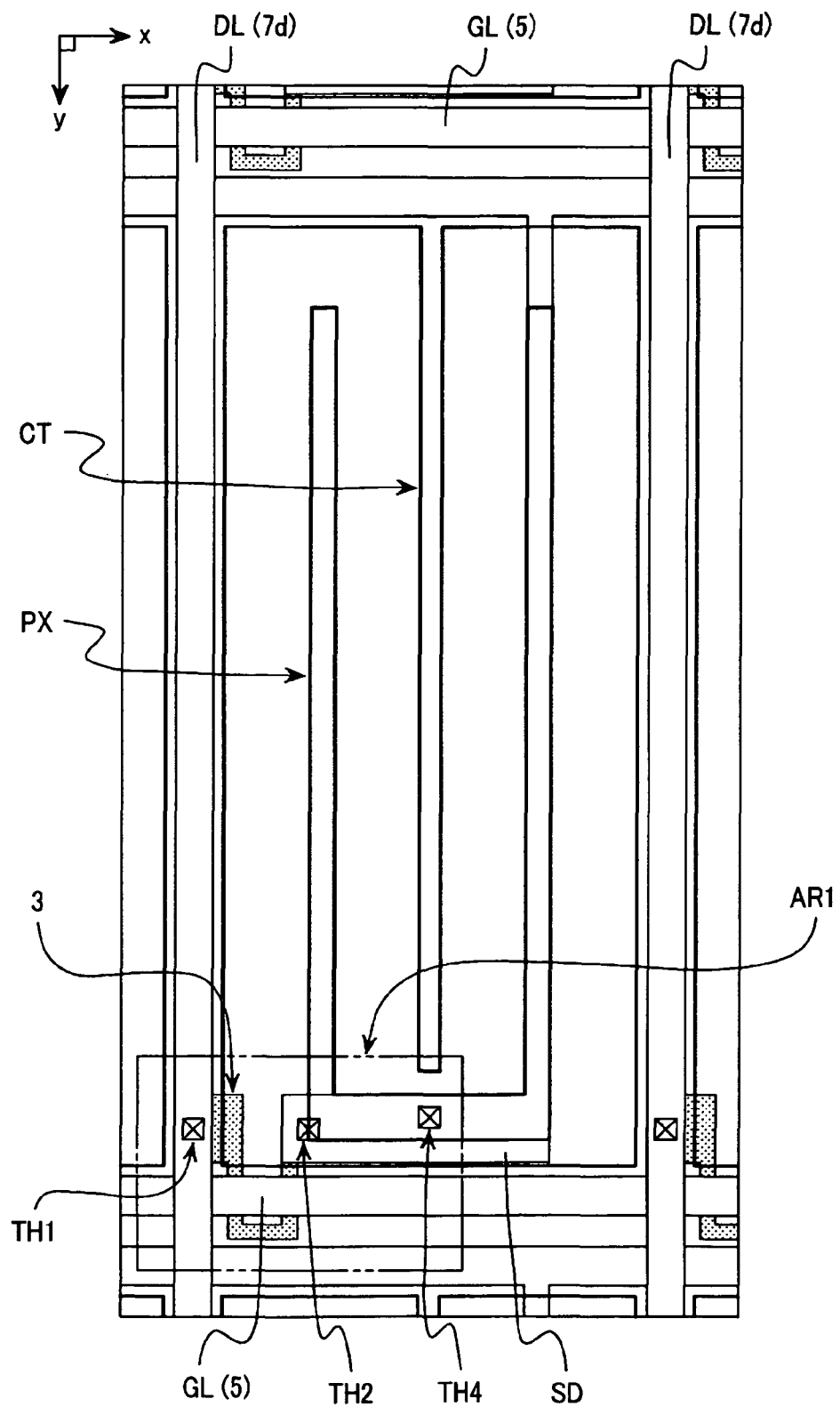
FIG. 7A is a schematic plan view showing a structural example of a pixel in a conventional TFT substrate.
Figure 7B:
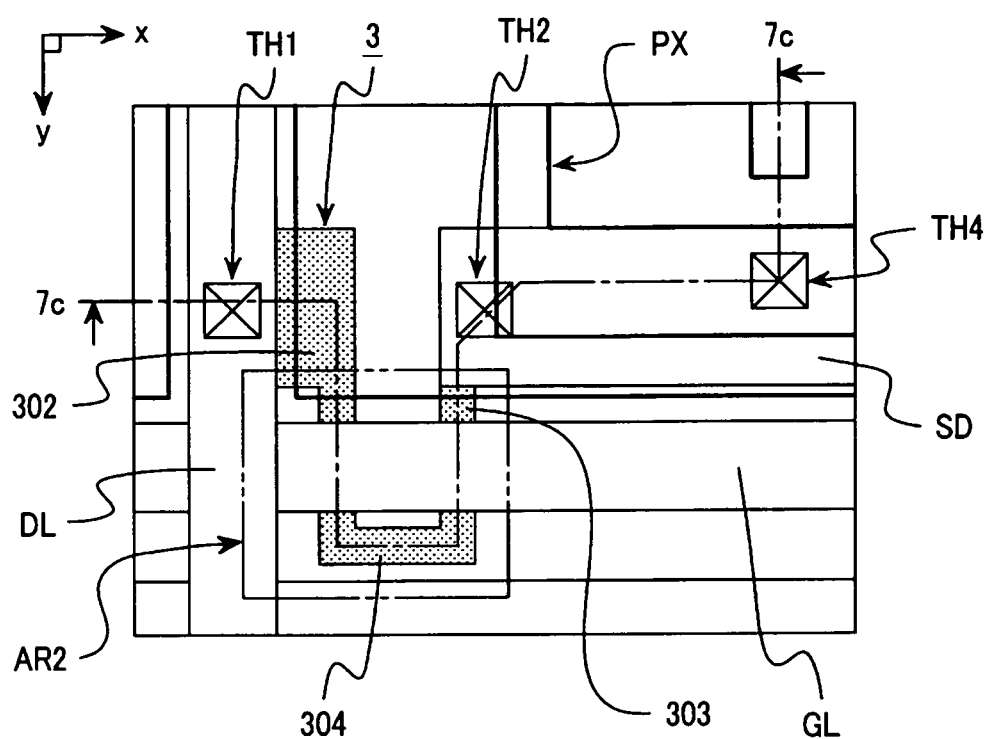
FIG. 7B is a schematic enlarged plan view showing an area AR1 of FIG. 7A.

FIG. 7A is a schematic plan view showing a structural example of a pixel in a conventional TFT substrate. FIG. 7B is a schematic enlarged plan view showing an area AR1 of FIG. 7A. FIG. 7C is a cross sectional view taken along a line 7c-7c of FIG. 7B.

Figure 8A:
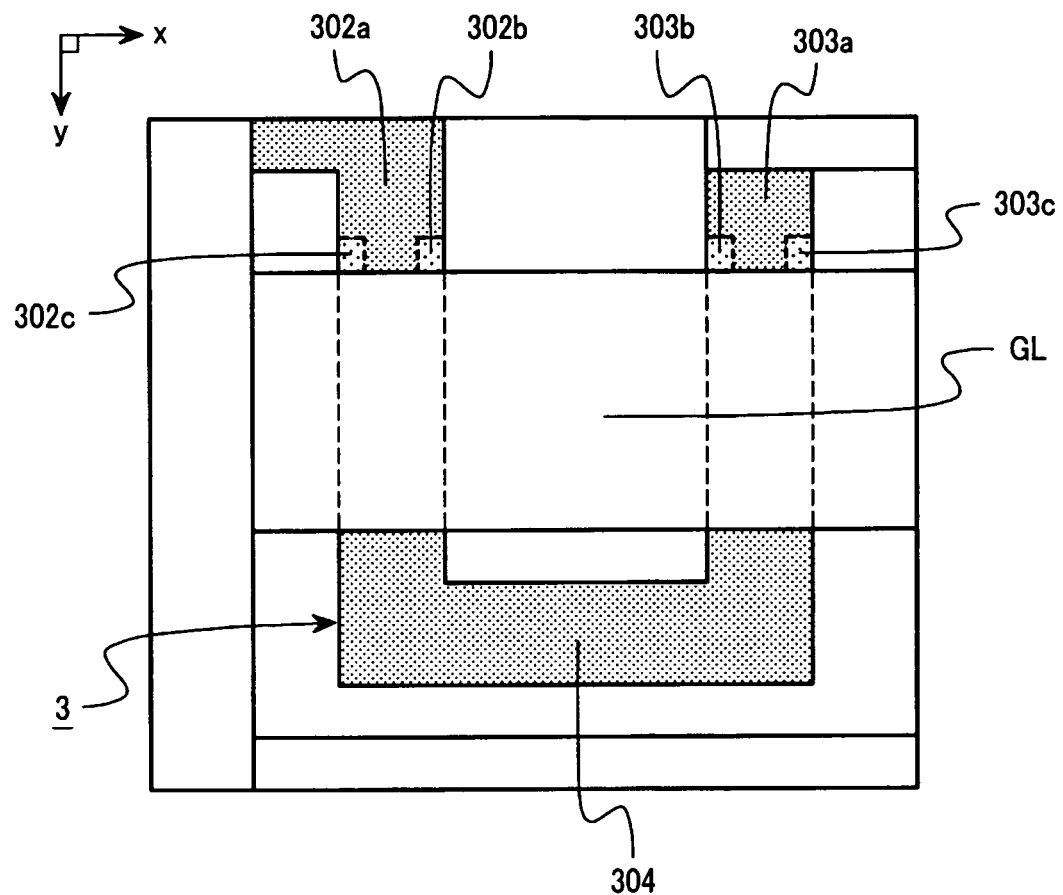
FIG. 8A is a schematic plan view showing a structural example in a case where the present invention is applied to the TFT element of FIGS. 7A to 7C.
Figure 8B:
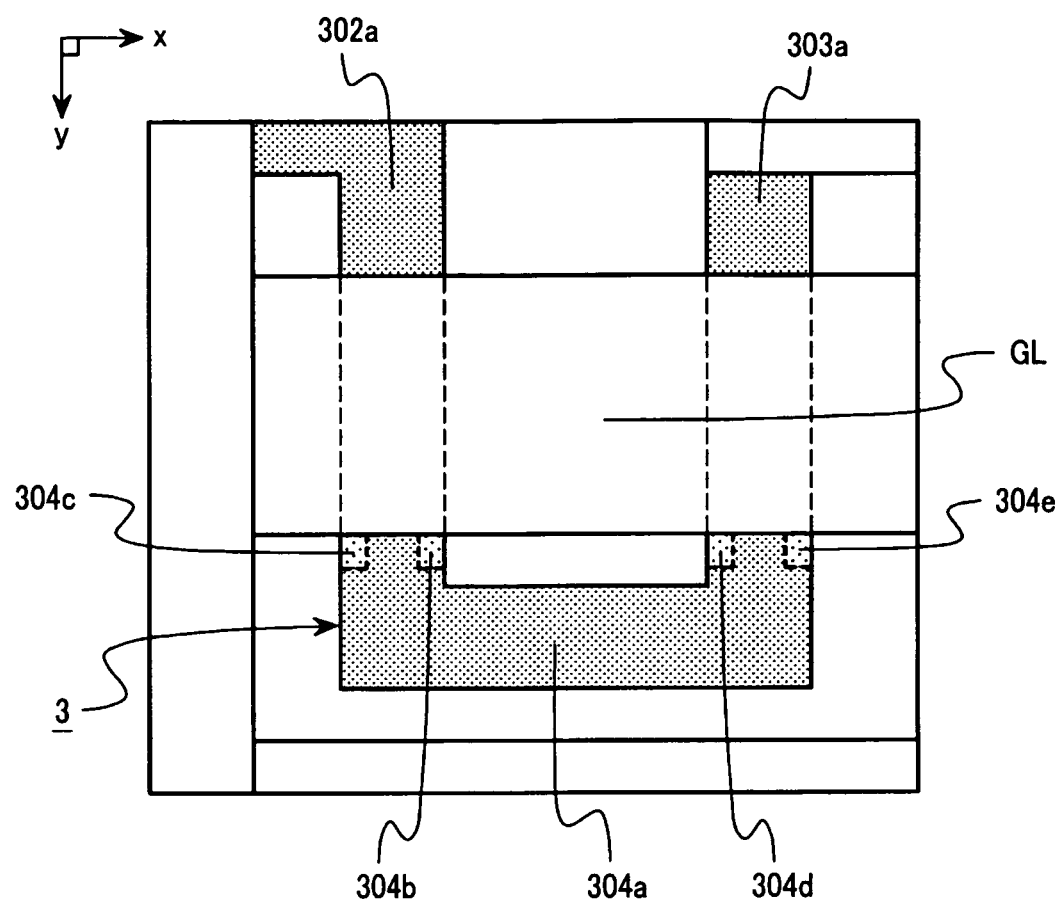
FIG. 8B is a schematic plan view showing another structural example in the case where the present invention is applied to the TFT element of FIGS. 7A to 7C.

FIG. 8A is a schematic plan view showing a structural example in a case where the present invention is applied to the TFT element of FIGS. 7A to 7C. FIG. 8B is a schematic plan view showing another structural example in a case where the present invention is applied to the TFT element of FIGS. 7A to 7C. Note that FIGS. 8A and 8B are the schematic enlarged view showing an area AR2 of FIG. 7B.

Each of pixels included in the display area DA of the conventional TFT substrate 8 has the TFT element serving as the switching element and the pixel electrode connected to the source of the TFT element. The gate of the TFT element serving as the switching element is connected to corresponding one of the scanning signal lines GL and the drain thereof is connected to corresponding one of the video signal lines DL. Whether the terminal of the TFT element serving as the switching element, which is connected to the pixel electrode, is the source or the drain actually depends on a potential (polarity) of the signal applied to the video signal line DL.

The semiconductor layer of the TFT element serving as the switching element in the conventional TFT substrate 8 is made of, for example, amorphous silicon in many cases. In recent years, the number of cases where the semiconductor layer is made of polycrystalline silicon increases.

A structure of a pixel in the TFT substrate 8 including the TFT element (switching element) using polycrystalline silicon is, for example, the structure as shown in FIGS. 7A to 7C. That is, the semiconductor layer 3 made of polycrystalline silicon, the first insulating film 4 serving as the gate insulating film of the TFT element, the scanning signal line GL serving as the gate electrode 5, the second insulating film 6, the video signal line DL, a source electrode SD, a third insulating film 14, a pixel electrode PX, and an opposite electrode CT are laminated on the base insulating layer 2 formed on the surface of the insulating substrate 1.

The scanning signal line GL is a wiring serving as the gate electrode 5 of the TFT element described in Embodiments 1 to 3. The semiconductor layer 3 is formed into a two-dimensional shape so as to cross the scanning signal line GL at two locations. That is, the TFT element shown in FIGS. 7A to 7C has the dual gate structure as in the case of the TFT element of the analog switch circuit described in Embodiment 3.

The video signal line DL is connected to the second region 302 of the semiconductor layer 3 through the through-hole TH1. The source electrode SD is connected to the third region 303 of the semiconductor layer 3 through the through-hole TH2. The pixel electrode PX is connected to the source electrode SD through a though hole TH4.

The present invention is applied as follows to the TFT element (switching element) having the structure described above. For example, as shown in FIG. 8A, the second region 302 of the semiconductor layer 3 preferably includes the first impurity diffusion region 302a serving as one of the source and the drain and the second impurity diffusion regions 302b and 302c serving as barriers. The third region 303 of the semiconductor layer 3 preferably includes the first impurity diffusion region 303a serving as one of the source and the drain depending on the function of the first impurity diffusion region 302a, and the second impurity diffusion regions 303b and 303c serving as barriers.

As also described in Embodiment 4, in the case of the TFT element having the dual gate structure, for example, as shown in FIG. 8B, a fourth region 304 sandwiched between the two first regions (regions overlapping with the scanning signal line GL) preferably includes a first impurity diffusion region 304a serving as the source and the drain of a MOS transistor and second impurity diffusion regions 304b, 304c, 304d, and 304e serving as barriers.

The structures shown in FIGS. 7A to 7C and 8A and 8B are the examples of the structure of the pixel having the TFT element (switching element) using the polycrystalline silicon. Therefore, a two-dimensional layout including the TFT element (switching element), the pixel electrode PX, and the opposite electrode CT can be changed as appropriate.

In Embodiment 4, the example of the TFT substrate 8 of the liquid crystal display panel is described. However, the present invention is not limited thereto. The present invention can be applied to any substrate in which integrated circuits such as driver circuits are located and incorporated outside the display area or any display panel in which the TFT element using the polycrystalline silicon is provided in the display area.

In Embodiment 4, the example of the liquid crystal display panel (TFT substrate 8) is described as the semiconductor device to which the present invention can be applied. However, the present invention is not limited thereto. The present invention can be applied to any semiconductor device in which the top gate TFT element using the polycrystalline semiconductor is formed above the insulating substrate 1.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
an insulating substrate; and
a transistor which is provided above the insulating substrate and includes a polycrystalline semiconductor layer, a gate insulating film, and a gate electrode, wherein:
the gate electrode is formed above the polycrystalline semiconductor layer through the gate insulating film;
the polycrystalline semiconductor layer includes a first region overlapping with the gate electrode in plan view, a second region, and a third region;
the first region is sandwiched between the second region and the third region;
the second region of the polycrystalline semiconductor layer includes a first impurity diffusion region and two second impurity diffusion regions which are opposite in conductivity type to the first impurity diffusion region;
the first region and the first impurity diffusion region are in contact with each other at a first boundary;
the first region and the two second impurity diffusion regions are in contact with each other at second boundaries;
the two second impurity diffusion regions sandwiching the first impurity diffusion region are provided along the gate electrode;
the first and the second boundaries extend along a first edge of the gate electrode;
the third region of the polycrystalline semiconductor layer is of a same conductivity type as that of the first impurity diffusion region, the third region does not include a diffusion region which is of a same conductivity type as that of the second impurity diffusion regions;
the third region and the first region are in contact with each other at a third boundary;
the third boundary is extended along second edge of the gate electrode which is opposed to the first edge;
the first boundary is sandwiched between the two second boundaries;
the second boundaries are disposed at a respective outer side of the first boundary;
the second impurity diffusion regions extend along the first region a distance greater than a distance the second impurity diffusion regions extend along the first impurity diffusion region;
the second region forms a source region of the transistor; and
the third region forms a drain region of the transistor.

2. A display device according to claim 1, wherein:
the transistor comprises a side transistor in which a leak current is generated when an off-voltage is applied to the gate electrode; and
each of the second boundaries has a length longer than a gate length of the side transistor.

3. A display device according to claim 1, wherein
the transistor comprises a plurality of side transistors in which a leak current is generated when an off-voltage is applied to the gate electrode.

4. A display device according to claim 1, further comprising
a first transistor whose first impurity diffusion layer conductivity type is an n-type and a second transistor whose first impurity diffusion layer conductivity type is a p-type, which are formed above the insulating substrate.

5. A display device according to claim 1, further comprising
a complementary inverter circuit which is formed above the insulating substrate and includes a first transistor whose first impurity diffusion layer conductivity type is an n-type and a second transistor whose first impurity diffusion layer conductivity type is a p-type.

6. A display device according to claim 1, further comprising
an analog switch circuit which is formed above the insulating substrate and includes a first transistor whose first impurity diffusion layer conductivity type is an n-type and a second transistor whose first impurity diffusion layer conductivity type is a p-type.

7. A display device according to claim 1, further comprising
a plurality of scanning signal lines, a plurality of video signal lines, a plurality of switching elements, a plurality of pixel electrodes, and an integrated circuit including the transistor, which are formed above the insulating substrate, wherein:
the plurality of switching elements and the plurality of pixel electrodes are arranged in matrix to form a display area; and
the integrated circuit is provided outside the display area.

8. A display device, comprising:
an insulating substrate; and
a TFT element which is provided above the insulating substrate and includes a semiconductor layer with a polycrystalline semiconductor, a gate insulating film, and a gate electrode, wherein:

the gate electrode three-dimensionally crosses the semiconductor layer;

the semiconductor layer includes at least one first region having a form overlapping with the gate electrode in plan view, a second region, and a third region;

the second region and the third region sandwich the first region and are in contact with the first region;

the second region includes a first impurity diffusion region serving as a source of the TFT element and a second impurity diffusion region which is opposite in conductivity type to the first impurity diffusion region;

the first region and the second region have a boundary therebetween and the boundary includes a first boundary at which the first region and the first impurity diffusion region are in contact with each other and two second boundaries at which the first region and the second impurity diffusion region are in contact with each other;

wherein the first and the second boundaries extend along an edge of the gate electrode, wherein the two second boundaries sandwich the first boundary and are located closer to end portions of the semiconductor layer than the first boundary, and wherein the second impurity diffusion regions extend along the first region a distance greater than a distance the second impurity diffusion regions extend along the first impurity diffusion region.

9. A display device according to claim 8, wherein:

the TFT element comprises side transistors which are provided in the end portions of the semiconductor layer and in which a leak current is generated when an off-voltage is applied to the gate electrode; and each of the two second boundaries has a length in an extension direction of the gate electrode crossing the semiconductor layer, which is longer than a gate length of the side transistors.

10. A display device according to claim 8, wherein one semiconductor layer of the TFT element formed above the insulating substrate includes a plurality of the first regions.

11. A display device according to claim 8, further comprising a first TFT element whose first impurity diffusion layer conductivity type is an n-type and a second TFT element whose first impurity diffusion layer conductivity type is a p-type, which are formed above the insulating substrate.

12. A display device according to claim 8, further comprising a complementary inverter circuit which is formed above the insulating substrate and includes a first TFT element whose first impurity diffusion layer conductivity type is an n-type and a second TFT element whose first impurity diffusion layer conductivity type is a p-type.

13. A display device according to claim 8, further comprising an analog switch circuit which is formed above the insulating substrate and includes a first TFT element whose first impurity diffusion layer conductivity type is an n-type and a second TFT element whose first impurity diffusion layer conductivity type is a p-type.

14. A display device according to claim 8, further comprising:

a display area which is formed above the insulating substrate and includes a plurality of scanning signal lines, a plurality of video signal lines, a plurality of switching elements, and a plurality of pixel electrodes, which are arranged in matrix; and an integrated circuit including the TFT element, which is formed outside the display area.

15. A display device according to claim 8, further comprising:

a pixel electrode; and a switching element having a MIS structure, which is connected to the pixel electrode, wherein the pixel electrode and the switching element are formed above the insulating substrate.

16. The display device according to claim 1, wherein the first boundary and, the second boundaries extend continuously along the edge of the gate electrode.

17. The display device according to claim 8, wherein the first boundary and the second boundaries extend continuously along the edge of the gate electrode.

* * * * *